United States Patent
Colinge et al.

(10) Patent No.: US 9,899,398 B1
(45) Date of Patent: Feb. 20, 2018

(54) NON-VOLATILE MEMORY DEVICE HAVING NANOCRYSTAL FLOATING GATE AND METHOD OF FABRICATING SAME

(71) Applicant: Taiwan Semiconductor Manufacturing Co., Ltd., Hsin-Chu (TW)

(72) Inventors: Jean-Pierre Colinge, Hsin-Chu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 15/220,171

(22) Filed: Jul. 26, 2016

(51) Int. Cl.
*H01L 29/788* (2006.01)
*H01L 27/11551* (2017.01)
*H01L 29/66* (2006.01)
*H01L 21/28* (2006.01)
*H01L 29/06* (2006.01)
(Continued)

(52) U.S. Cl.
CPC .. *H01L 27/11551* (2013.01); *H01L 21/28273* (2013.01); *H01L 29/0673* (2013.01); *H01L 29/413* (2013.01); *H01L 29/42324* (2013.01); *H01L 29/4908* (2013.01);
(Continued)

(58) Field of Classification Search
CPC ........... H01L 29/0673; H01L 29/42392; H01L 29/66439; H01L 29/42324; H01L 29/42332; H01L 29/42336; H01L 29/785; H01L 29/7849; H01L 29/7853; H01L 29/7854; H01L 29/7855; H01L 29/7856; H01L 27/0924; H01L 27/0886; H01L 27/11517; H01L 27/11521; H01L 27/1156
See application file for complete search history.

(56) References Cited

U.S. PATENT DOCUMENTS 8,536,039 B2   9/2013 Chih et al.
8,815,691 B2   8/2014 Colinge et al.
(Continued)

OTHER PUBLICATIONS

Xiaohui Tang et al., "Energy-Band Engineering for Improved Charge Retention in Fully Self-Aligned Double Floating-Gate Single-Electron Memories," Nano Letters 2011, pp. 4520-4526, ACS Publications.

*Primary Examiner* — Matthew Landau
*Assistant Examiner* — Scott Stowe
(74) *Attorney, Agent, or Firm* — Haynes and Boone, LLP

(57) ABSTRACT

Methods are disclosed herein for fabricating non-volatile memory devices. An exemplary method forms a heterostructure over a substrate. The heterostructure includes at least one semiconductor layer pair having a first semiconductor layer and a second semiconductor layer disposed over the first semiconductor layer, the second semiconductor layer being different than the first semiconductor layer. A gate structure having a dummy gate is formed over a portion of the heterostructure, such that the gate structure separates a source region and a drain region of the heterostructure and a channel region is defined between the source region and the drain region. During a gate replacement process, a nanocrystal floating gate is formed in the channel region from the second semiconductor layer. In some implementations, during the gate replacement process, a nanowire is also formed in the channel region from the first semiconductor layer.

20 Claims, 21 Drawing Sheets

(51) Int. Cl.
*H01L 29/49* (2006.01)
*H01L 29/41* (2006.01)
*H01L 29/423* (2006.01)

(52) U.S. Cl.
CPC .... *H01L 29/6656* (2013.01); *H01L 29/66545* (2013.01); *H01L 29/66825* (2013.01)

(56) References Cited

U.S. PATENT DOCUMENTS

| | | |
|---|---|---|
| 9,006,829 B2 | 4/2015 | Ching et al. |
| 9,343,142 B2 * | 5/2016 | Bangsaruntip ...... G11C 11/5671 |
| 2006/0046383 A1 | 3/2006 | Chen et al. |
| 2008/0135949 A1 | 6/2008 | Lo et al. |
| 2014/0175379 A1 * | 6/2014 | Chu-Kung ............ H01L 29/267 |
| | | 257/20 |
| 2014/0175561 A1 | 6/2014 | Colinge |
| 2015/0035071 A1 | 2/2015 | Ching et al. |
| 2015/0325648 A1 | 11/2015 | Cea et al. |

* cited by examiner

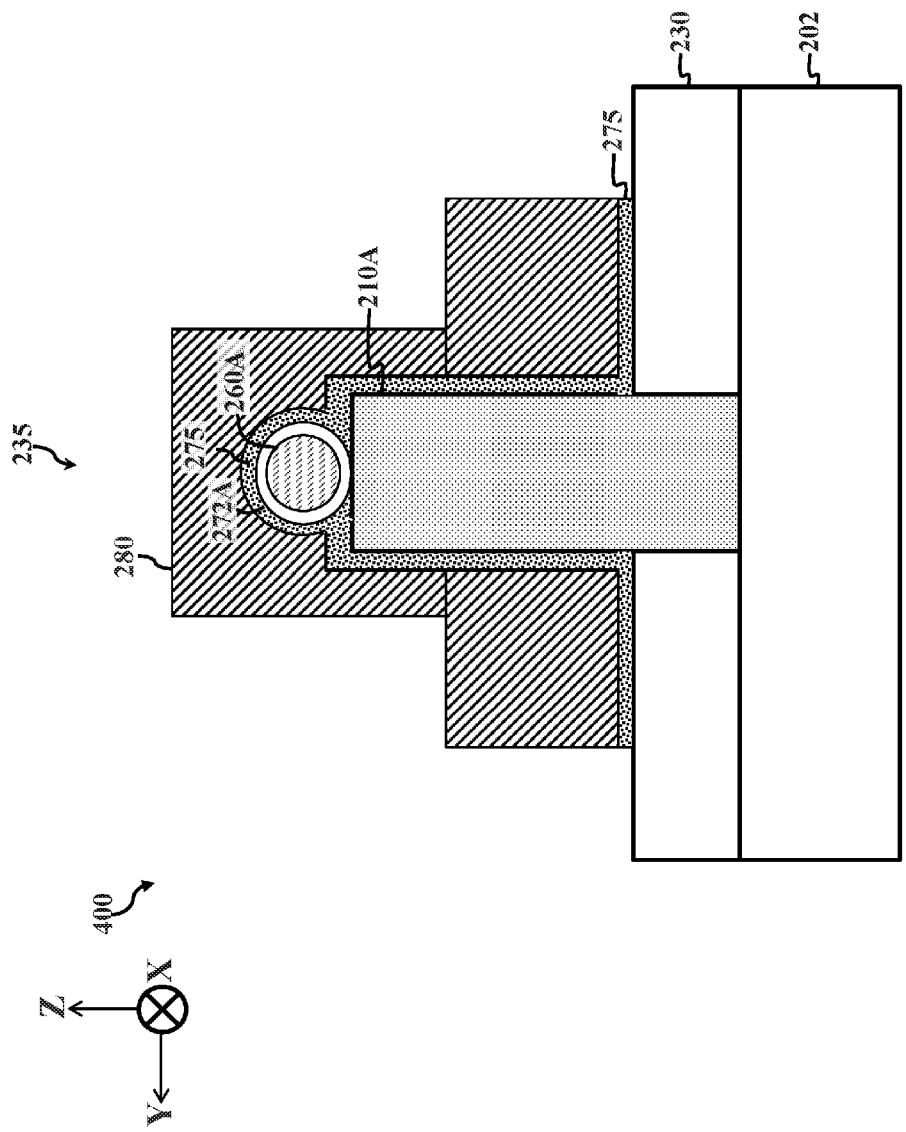

NON-VOLATILE MEMORY DEVICE HAVING NANOCRYSTAL FLOATING GATE AND METHOD OF FABRICATING SAME

BACKGROUND

Non-volatile memory generally refers to any memory or storage that can retain stored data even when no power is applied. Exemplary non-volatile memories include flash memories, which are widely used in memory cards and USB drives to store data and to transfer data between a computer and other digital devices, such as cameras and mobile phones. Flash memories often implement floating gate transistors, which generally include a metal-oxide-semiconductor field effect transistor (MOSFET) capacitively coupled to a number of secondary gates (such as control gates). Because the floating gate is electrically isolated from the secondary gates, any charge trapped on the floating gate is retained for a long period of time without any power supply. Charge stored on the floating gate can be altered by applying voltages to source, drain, and/or secondary gates. Nanocrystal charge trap structures are currently being explored for providing the charge trapping region in the floating gate, as such structures can improve charge retention, operate at room temperature, and facilitate quick access. Although existing non-volatile memory devices implementing nanocrystal charge trap structures and methods for fabricating such have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 16A and FIG. 16B are fragmentary diagrammatic cross-sectional views of yet another non-volatile memory device, in portion or entirety, which can be fabricated according to the method of FIG. 1.

DETAILED DESCRIPTION

Figure 1:
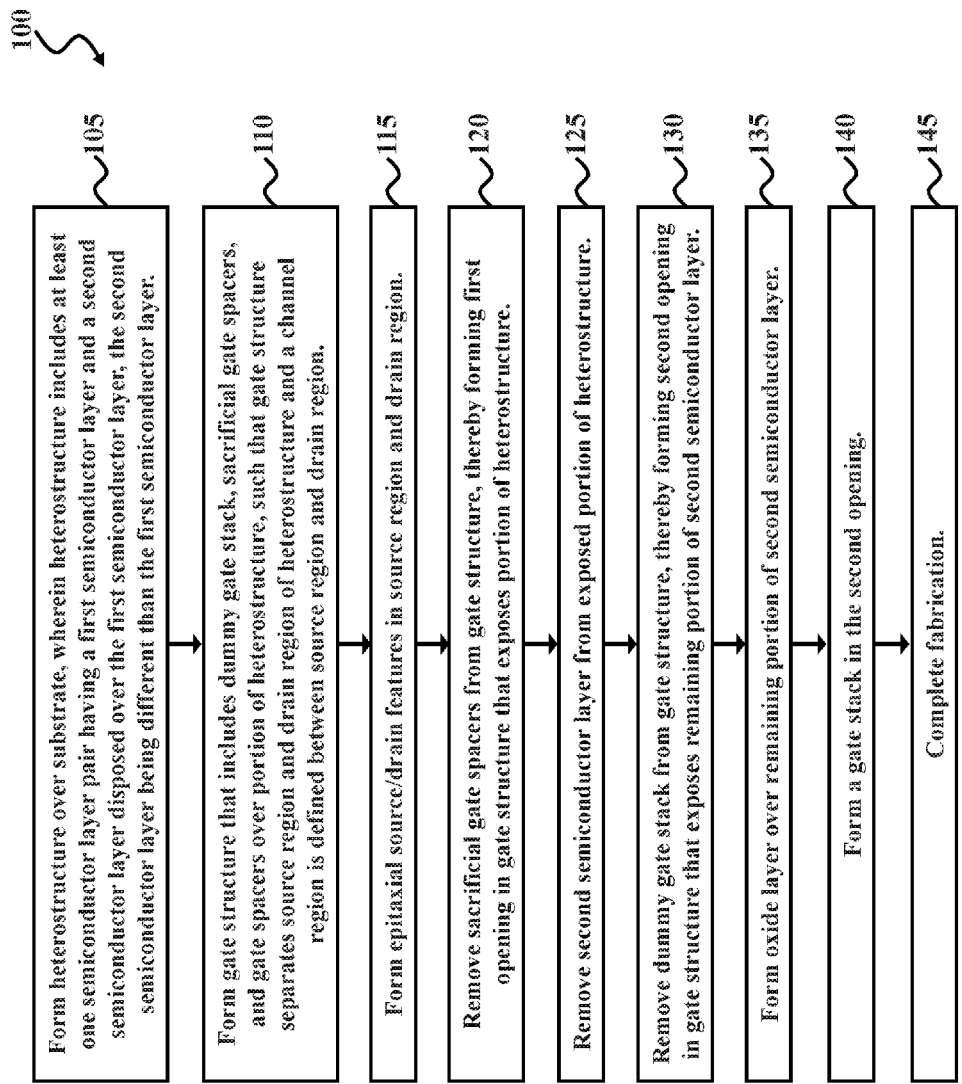
FIG. 1 is a flow chart of a method for fabricating a non-volatile memory device according to various aspects of the present disclosure.

The present disclosure relates generally to non-volatile memory devices, and more particularly, to non-volatile memory devices having nanocrystal floating gates and methods for fabricating non-volatile memory devices having nanocrystal floating gates.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 for fabricating an integrated circuit device according to various aspects of the present disclosure. In the present embodiment, method 100 fabricates an integrated circuit device that includes a non-volatile memory device. At block 105, a heterostructure is formed over a substrate. The heterostructure includes at least one semiconductor layer pair having a first semiconductor layer and a second semiconductor layer disposed over the first semiconductor layer. The second semiconductor layer is different than the first semiconductor layer. At block 110, a gate structure is formed over a portion of the heterostructure, such that the gate structure separates a source region and a drain region of the heterostructure and a channel region is defined between the source region and the drain region. The gate structure includes a dummy gate stack, sacrificial gate spacers, and gate spacers. At block 115, epitaxial source/drain features are formed in the source region and the drain region. At block 120, the sacrificial gate spacers are removed from gate structure, thereby forming first opening in gate structure that exposes portion of heterostructure. At block 125, the second semiconductor layer is removed from exposed portions of the heterostructure. At block 130, the dummy gate stack is removed from the gate structure, thereby forming a second opening in the gate structure that exposes a remaining portion of the second semiconductor layer. At block 135, an oxide layer is formed over the remaining portion of the second semiconductor layer. At block 240, a gate stack is formed in the second opening of the gate structure. At block 145, the method 100 may continue to complete fabrication of the non-volatile memory device. Additional steps can be provided before, during, and after method 100, and some of the steps described can be moved, replaced, or eliminated for additional embodiments of method 100. The discussion that follows illustrates various embodiments of an integrated circuit device having a non-volatile memory device that can be fabricated according to method 100.

Figure 2:
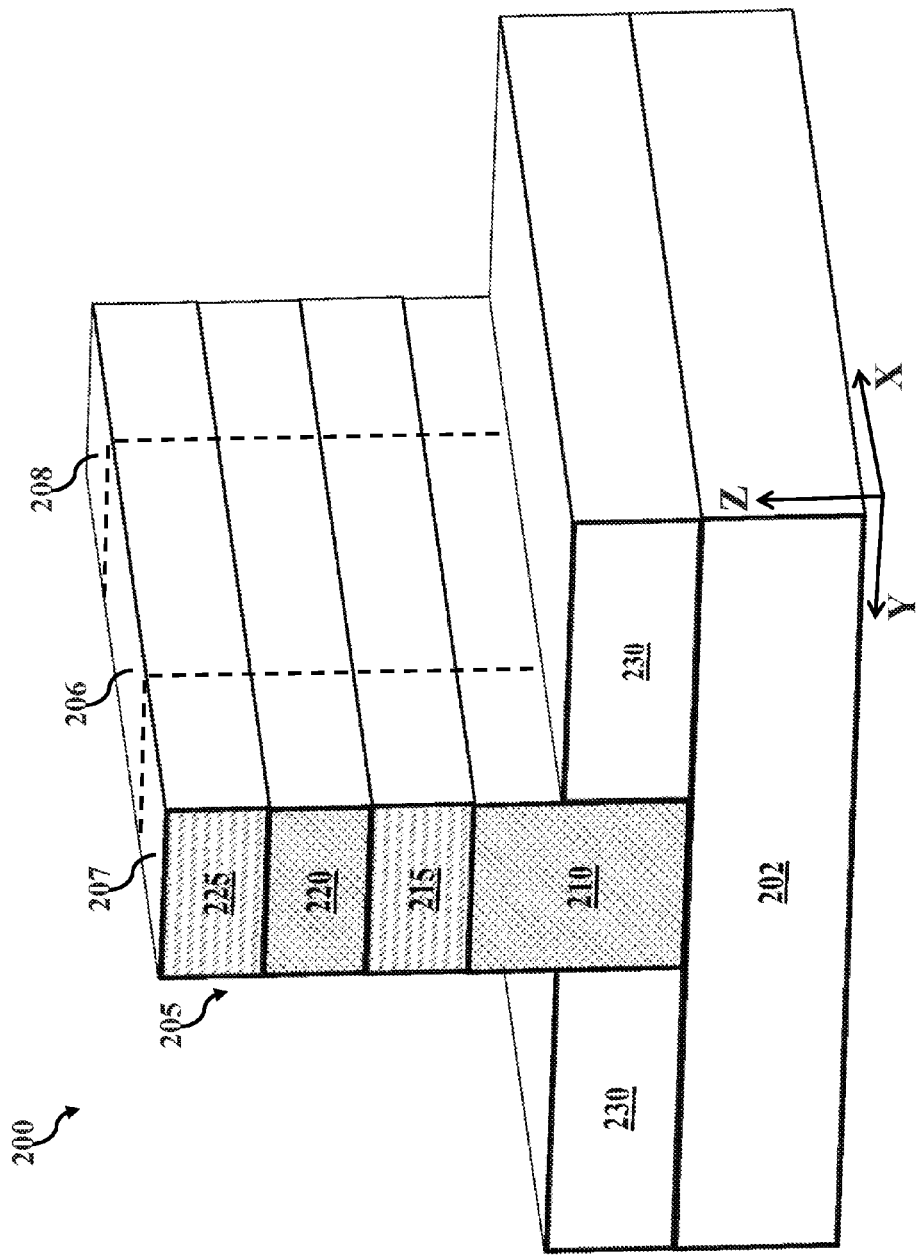
FIGS. 2-14 are fragmentary diagrammatic views of a non-volatile memory device 200, in portion or entirety, at various fabrication stages, such as those associated with the method of FIG. 1, according to various aspects of the present disclosure.

FIGS. 2-14 are fragmentary diagrammatic views of a non-volatile memory device 200, in portion or entirety, at various fabrication stages (such as those associated with method 100) according to various aspects of the present disclosure. In particular, FIG. 2 is a perspective, three-dimensional view of non-volatile memory device 200 in an X-Y-Z plane, FIGS. 3-13 are diagrammatic cross-sectional views of non-volatile memory device 200 in an X-Z plane, and FIG. 14 is a diagrammatic cross-sectional view of non-volatile memory device 200 in a Y-Z plane. Examples of non-volatile memory include non-volatile random access memory (NVRAM), flash memory, electrically erasable programmable read only memory (EEPROM), electrically programmable read-only memory (EPROM), and other suitable memory types. In various embodiments, non-volatile memory device 200 is included in a microprocessor, memory cell, and/or other integrated circuit device. In some implementations, non-volatile memory device 200 may be a portion of an integrated circuit (IC) chip, a system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, high voltage transistors, high frequency transistors, other suitable components, or combinations thereof. FIGS. 2-14 have been simplified for the sake of clarity to better understand the inventive concepts of the present disclosure. Additional features can be added in non-volatile memory device 200, and some of the features described below can be replaced, modified, or eliminated in other embodiments of non-volatile memory device 200.

Figure 3:
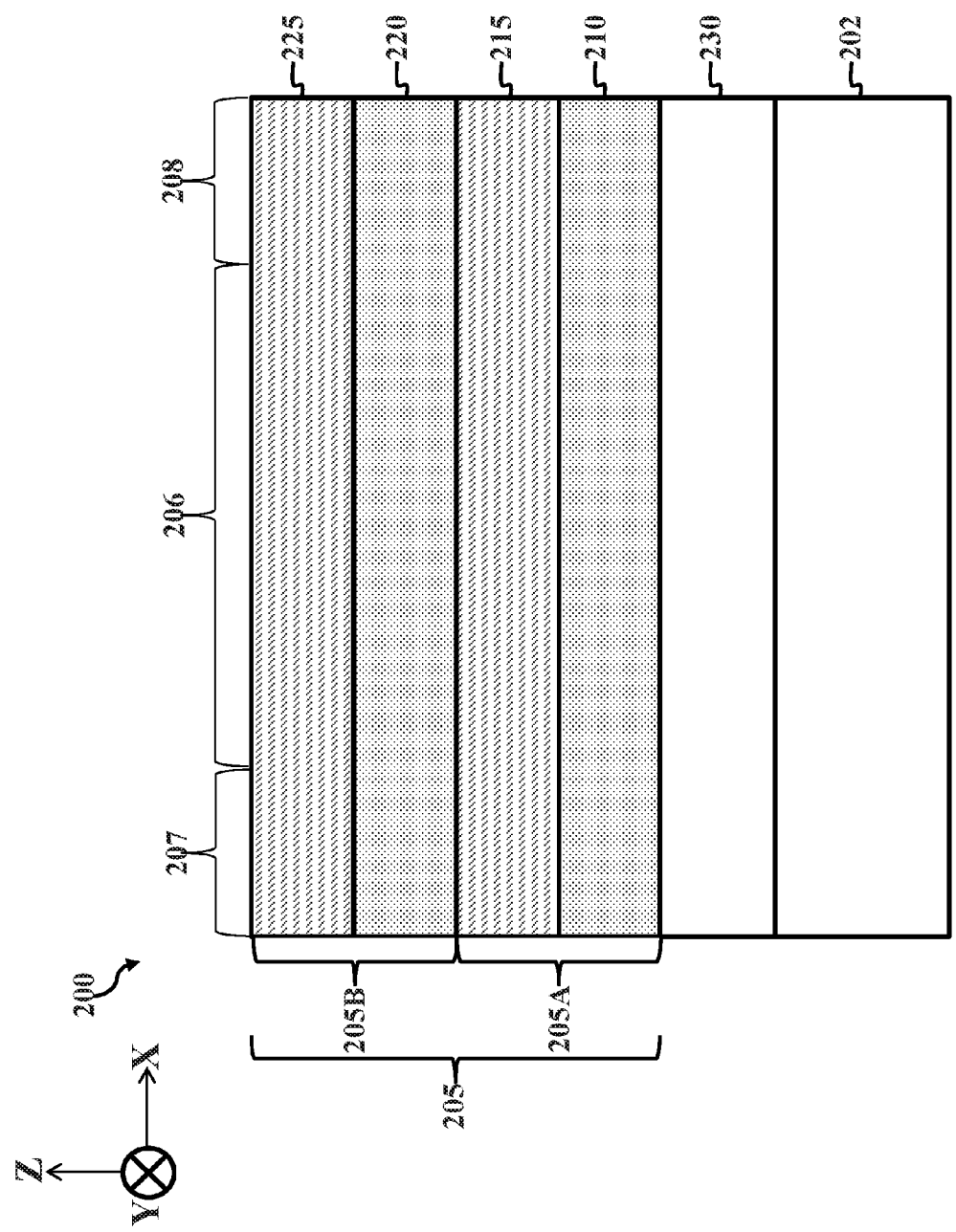

In FIG. 2 and FIG. 3, non-volatile memory device 200 includes a substrate (wafer) 202. In the depicted embodiment, substrate 202 is a silicon substrate. Alternatively or additionally, substrate 202 includes germanium, an alloy semiconductor (for example, SiGe), another suitable semiconductor material, or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) depending on design requirements of non-volatile memory device 200. In some implementations, substrate 202 includes p-type doped regions (for example, p-type wells) doped with p-type dopants, such as boron (for example, $BF_2$), indium, other p-type dopant, or combinations thereof. In some implementations, substrate 202 includes n-type doped regions (for example, n-type wells) doped with n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. Doping may be implemented using a process such as ion implantation or diffusion in various steps and techniques.

Non-volatile memory device 200 further includes a heterostructure 205 disposed over substrate 202. In FIG. 2, heterostructure 205 (also referred to as a fin and/or fin structure) extends along an x-direction, having a width defined in a y-direction and a height defined in a z-direction. A channel region 206, source region 207, and drain region 208 are defined in heterostructure 205, where channel region 206 (also referred to as a gate region herein) is disposed between source region 207 and drain region 208 (also generally referred to as source/drain regions). In FIG. 2 and FIG. 3, heterostructure 205 includes a semiconductor layer stack having a length that extends in the x-direction (in other words, horizontally), such that channel region 206 extends horizontally between source region 207 and drain region 208. The semiconductor layer stack includes various semiconductor layers, such as a semiconductor layer 210, a semiconductor layer 215, a semiconductor layer 220, and a semiconductor layer 225. Though semiconductor layer 210 is depicted as a separate layer, the present disclosure contemplates embodiments where semiconductor layer 210 is an extension of substrate 202 (for example, where portions of substrate 202 are removed to form semiconductor layer 210 extending from substrate 202). The semiconductor layers include any suitable material, such as silicon, germanium, silicon germanium, other suitable material, or combinations thereof. The semiconductor layers can include same or different materials, etching rates, constituent atomic percentages, constituent weight percentages, thicknesses (heights), and/or configurations depending on design requirements of non-volatile memory device 200. In some implementations, the semiconductor layer stack includes at least one semiconductor layer pair having a first semiconductor layer and a second semiconductor layer disposed over the first semiconductor layer, where the second semiconductor layer is different than the first semiconductor layer. For example, in the depicted embodiment, heterostructure 205 includes a semiconductor layer pair 205A that includes semiconductor layer 210 and semiconductor layer pair 215 and a semiconductor layer pair 205B that includes semiconductor layer 220 and semiconductor layer 225, where semiconductor layer 210 and semiconductor layer 220 include a same material and semiconductor layer 215 and semiconductor layer 225 include a same material. The semiconductor layer stack can include more or less semiconductor layers and/or configurations depending on design requirements of non-volatile memory device.

In some implementations, the semiconductor layer stack includes semiconductor layers having different etching rates. For example, semiconductor layer 210 and semiconductor layer 220 include a material having a first etching rate, and semiconductor layer 215 and semiconductor layer 225 include a material having a second etching rate. The material of semiconductor layer 215 and semiconductor layer 225 may exhibit a high etch rate relative to the material of semiconductor layer 210 and semiconductor layer 220, or vice versa. In some implementations, the semiconductor layer stack includes alternating semiconductor layers, such as semiconductor layers composed of a first material and semiconductor layers composed of a second material. For example, heterostructure 205 can include a semiconductor layer stack that alternates silicon layers and silicon germanium layers (for example, Si/SiGe/Si/SiGe from a bottom to a top of heterostructure 205). In such implementations, semiconductor layer 210 and semiconductor layer 220 are silicon layers, and semiconductor layer 215 and semiconductor layer 225 are silicon germanium layers. In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, heterostructure 205 can include a semiconductor layer stack that includes silicon germanium layers having alternating silicon atomic percentages and/or germanium atomic percentages (for example, $Si_aGe_b/Si_xGe_y/Si_aGe_b/Si_xGe_y$ from a bottom to a top of heterostructure 205). In such implementations, semiconductor layer 210 and semiconductor layer 220 are silicon germanium layers having a first silicon atomic percentage and/or a first germanium atomic percentage, and semiconductor layer 215 and semiconductor layer 225 are silicon germanium layers having a second silicon atomic percentage and/or a second germanium atomic percentage that is different than the first silicon atomic percentage and/or first germanium atomic percentage. In some implementations, a germanium atomic percentage of semiconductor layer 215 and semiconductor layer 225 ranges from about 20% to about 60%, while a germanium atomic percentage of semiconductor layer 210 and semiconductor layer 220 ranges from about 0% to about 30%. In some implementations, a silicon atomic percentage of semiconductor layer 215 and semiconductor layer 225 ranges from about 40% to about 80%, while a silicon atomic percentage of semiconductor layer 220 and semiconductor layer 230 ranges from about 70% to about 100%. For example, semiconductor layer 210 and semiconductor layer 220 are silicon germanium layers having a silicon atomic percentage of about 80% and a germanium atomic percentage of about 20%, while semiconductor layer 215 and semiconductor layer 225 are silicon germanium layers having a silicon atomic percentage of about 50% and a germanium atomic percentage of about 50%.

Heterostructure 205 is formed over substrate 202 using any suitable process. In some implementations, semiconductor layer 210 is epitaxially grown on substrate 202, semiconductor layer 215 is epitaxially grown on semiconductor layer 210, semiconductor layer 220 is epitaxially grown on semiconductor layer 215, and semiconductor layer 225 is epitaxially grown on semiconductor layer 220. An epitaxy process can use CVD deposition techniques (for example, vapor-phase epitaxy (VPE) and/or ultra-high vacuum CVD (UHV-CVD)), molecular beam epitaxy, other suitable epitaxial growth processes, or combinations thereof. In some implementations, a lithography and/or etching process is performed to form the fin-like structure of heterostructure 205, such that heterostructure 205 extends from substrate 202. The lithography process can include resist coating (for example, spin-on coating), soft baking, mask aligning, exposure, post-exposure baking, developing the resist, rinsing, drying (for example, hard baking), other suitable processes, or combinations thereof. Alternatively, the lithography process can be implemented or replaced by other methods, such as maskless lithography, electron-beam writing, ion-beam writing, and/or nanoimprint technology. The etching process can include a dry etching process, wet etching process, other suitable etching process, or combinations thereof. In some implementations, heterostructure 205 is formed by forming a resist layer over semiconductor layer 225, exposing the resist to a pattern, and developing the resist to form a masking element including the resist. The masking element is then used to etch (for example, by a reactive ion etch (RIE)) semiconductor layer 225, semiconductor layer 220, semiconductor layer 215, and semiconductor layer 210 to form heterostructure 205. In another example, heterostructure 205 is formed by a double-patterning lithography (DPL) process. DPL is a method of constructing a pattern on a substrate by dividing the pattern into two interleaved patterns. DPL allows enhanced feature (for example, fin) density. Various DPL methodologies may be used including double exposure (such as using two mask sets), resist freezing, extreme ultraviolet (EUV) lithography, other suitable processes, or combinations thereof.

An isolation feature(s) 230 is formed over and/or in substrate 202 to isolate various regions, such as various device regions, of non-volatile memory device 200. For example, isolation features 230 separate and isolate heterostructure (fin) 205 from other heterostructures (not shown) formed over substrate 202. Isolation features 230 include silicon oxide, silicon nitride, silicon oxynitride, other suitable isolation material, or combinations thereof. Isolation features 230 can include different structures, such as shallow trench isolation (STI) structures, deep trench isolation (DTI) structures, and/or local oxidation of silicon (LOCOS) structures. In some implementations, isolation features 230 include STI features that define and electrically isolate heterostructure 205 from other active device regions and/or passive device regions. For example, STI features can be formed by etching a trench in substrate 202 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features 230. In another example, STI features can be formed by depositing an insulator material over substrate 202 after forming heterostructure 205 (in some implementations, such that the insulator material layer fills gaps (trenches) between heterostructures) and etching back the insulator material layer to form isolation features 230. In some embodiments, STI features include a multi-layer structure that fills the trenches, such as a silicon nitride layer disposed over a thermal oxide liner layer.

Figure 4:
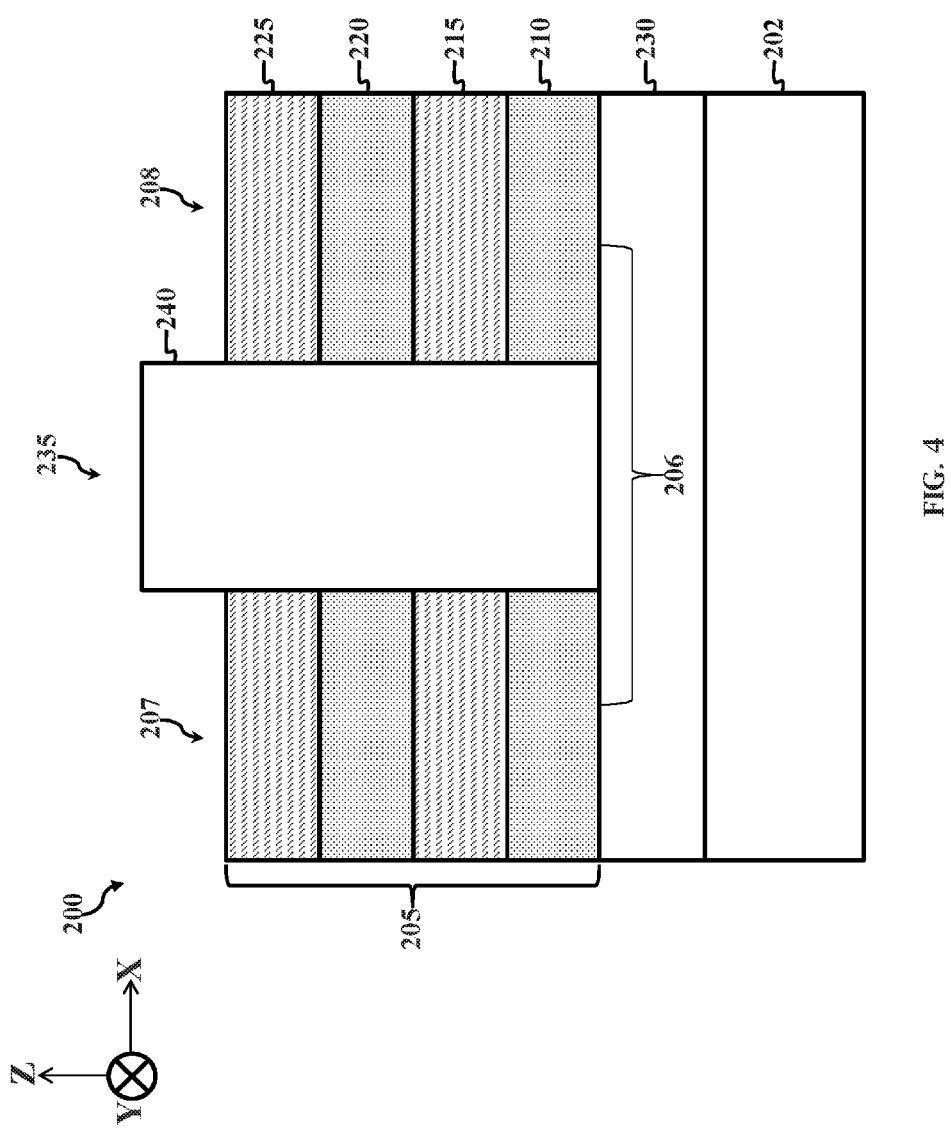
Figure 5:
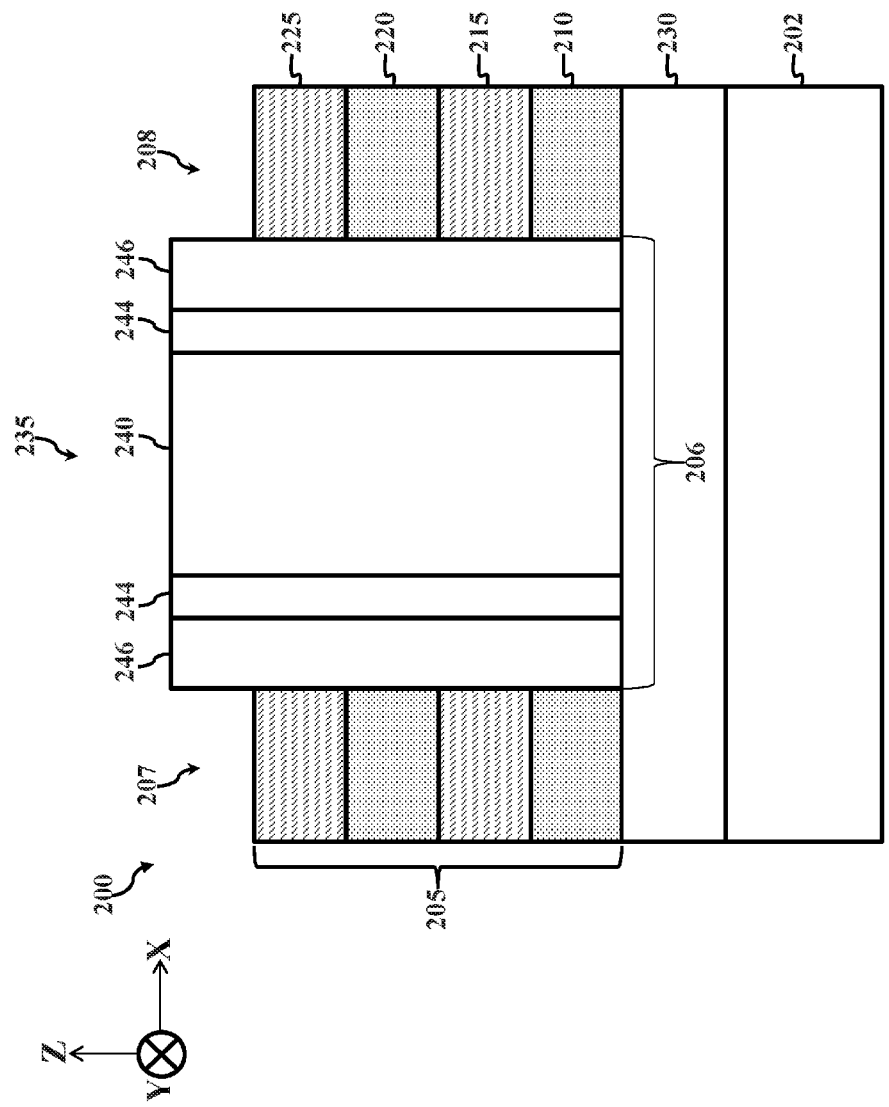

In FIG. 4 and FIG. 5, a gate structure 235 is formed over heterostructure 205. Gate structure 235 includes a dummy gate stack (represented by a dummy gate electrode 240, and in some implementations, a dummy gate dielectric), sacrificial gate spacers 244, and gate spacers 246. Gate structure 235 wraps a portion of heterostructure 205 in the Y-Z plane, particularly wrapping a portion of channel region 206. In the X-Z plane and the X-Y plane, gate structure 235 interposes source region 207 and drain region 208 of heterostructure 205. In the depicted embodiment, dummy gate electrode 240 includes polysilicon or other suitable dummy gate material. In implementations where the dummy gate stack includes a dummy gate dielectric disposed between dummy gate electrode 240 and heterostructure 205, the dummy gate dielectric includes a dielectric material (for example, silicon oxide), high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The dummy gate stack may include numerous other layers, for example, capping layers, interface layers, diffusion layers, barrier layers, hard mask layers, or combinations thereof. In an example, a capping layer, such as a TiN capping layer, is disposed between the dummy gate dielectric (or heterostructure 205 where the dummy gate dielectric is omitted from gate structure 235) and dummy gate electrode 240.

Gate structure 235 is formed by deposition processes, lithography processes, etching processes, other suitable processes, or combinations thereof. For example, in FIG. 4, a deposition process is performed to form a dummy gate electrode layer over substrate 202, particularly heterostructure 205 and isolation features 230. In some implementations, a deposition process is performed to form a dummy gate dielectric layer over heterostructure 205 before forming the dummy gate electrode layer, and the dummy gate electrode layer is formed over the dummy gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some implementations, the dummy gate dielectric layer) to form the dummy gate stack including dummy gate electrode 240 of gate structure 235, such that dummy gate electrode 240 wraps a portion of channel region 206. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

In FIG. 5, sacrificial gate spacers 244 and gate spacers 246 are formed adjacent to the dummy gate stack (for example, dummy gate electrode 240) of gate structure 235. Sacrificial gate spacers 244 are disposed adjacent to (for example, along sidewalls of) dummy gate electrode 240, and gate spacers 246 are disposed adjacent to (for example, along sidewalls of) sacrificial gate spacers 244. Sacrificial gate spacers 244 and gate spacers 246 each include a dielectric material, such as silicon oxide, silicon nitride, silicon oxynitride, silicon carbide, other suitable material, or combinations thereof. Sacrificial gate spacers 244 include a dielectric material different than gate spacers 246. For example, sacrificial gate spacers 244 include silicon oxide ($SiO_2$), and gate spacers 246 include silicon nitride (for example, $Si_3N_4$). In another example, sacrificial gate spacers 244 include silicon nitride, and gate spacers 246 include silicon carbon nitride (SiCN). In some implementations, sacrificial gate spacers 244 include a dielectric material having a different etching rate than gate spacers 246. For example, sacrificial gate spacers 244 include a first dielectric material having a first etching rate (such as silicon oxide), and gate spacers 246 include a second dielectric material having a second etching rate (such as silicon nitride). In some implementations, sacrificial gate spacers 244 include a material having a high etch rate relative to a material of gate spacers 246. In some implementations, sacrificial gate spacers 244 and/or gate spacers 246 include a multi-layer structure, such as a multi-layer structure including a silicon nitride layer and a silicon oxide layer. Sacrificial gate spacers 244 and gate spacers 246 are formed by any suitable process. For example, in the depicted embodiment, a silicon oxide layer can be deposited over heterostructure 205 and subsequently anisotropically etched (for example, dry etched) to form sacrificial gate spacers 244, and a silicon nitride layer can be deposited over heterostructure 205 and subsequently etched (for example, dry etched) to form gate spacers 246.

Figure 6:
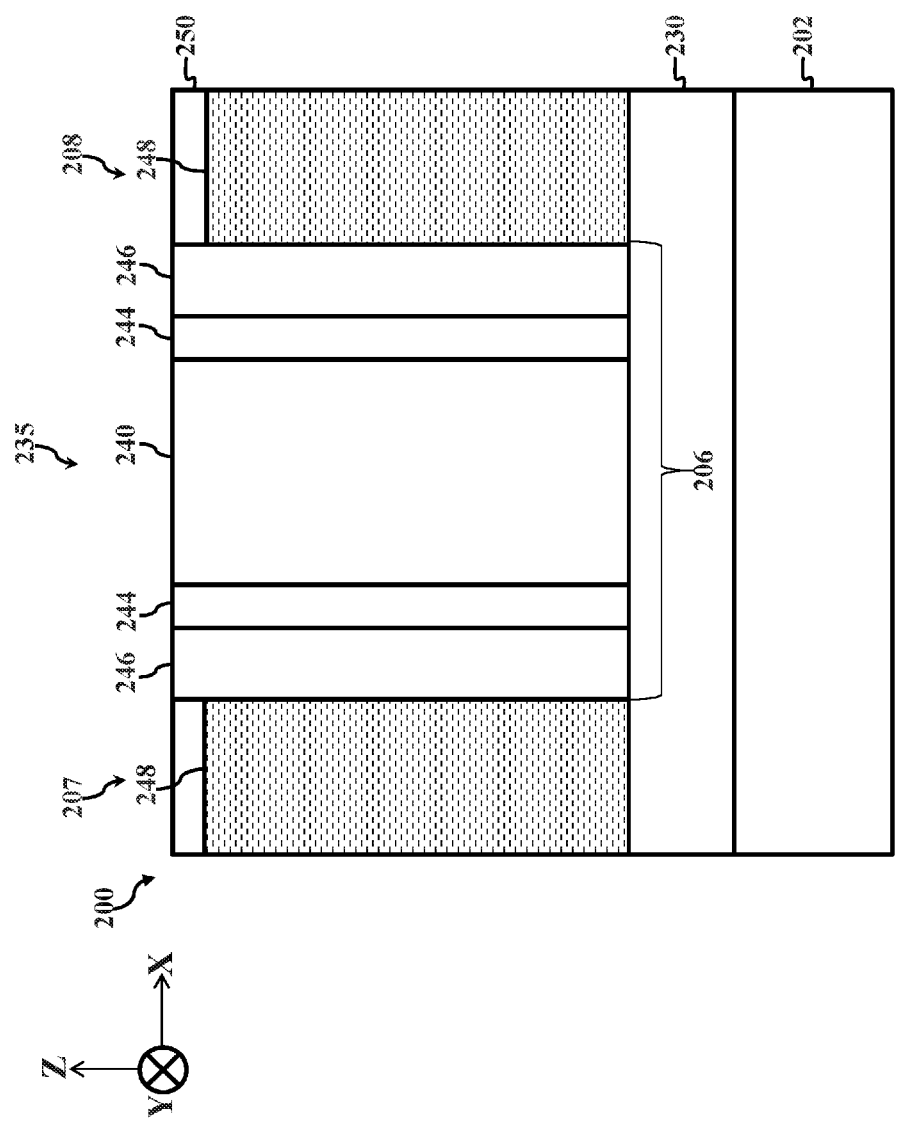

In FIG. 6, epitaxial source features and epitaxial drain features (referred to as epitaxial source/drain features) are formed in source/drain regions of heterostructure 205. For example, a semiconductor material is epitaxially (epi) grown on exposed portions of heterostructure 205, forming an epitaxial source/drain feature 248 in source region 207 and an epitaxial source/drain feature in drain region 208. An epitaxy process can use CVD deposition techniques (for example, vapor-phase epitaxy (VPE) and/or ultra-high vacuum CVD (UHV-CVD)), molecular beam epitaxy, other suitable epitaxial growth processes, or combinations thereof. The epitaxy process can use gaseous and/or liquid precursors, which interact with the composition of heterostructure 205 (in other words, interact with semiconductor layer 210, semiconductor layer 215, semiconductor layer 220, and semiconductor layer 225). Epitaxial source/drain features 248 may be doped with n-type dopants and/or p-type dopants. In some implementations, where non-volatile memory device 200 is configured as an n-type device (for example, having an n-channel), epitaxial source/drain features 248 are silicon epitaxial layers or silicon carbon epitaxial layers, where the silicon epitaxial layers or silicon carbon epitaxial layers are doped with phosphorous, other n-type dopant, or combinations thereof (for example, forming a Si:P epitaxial layer or a Si:C:P epitaxial layer). In some implementations, where non-volatile memory device 200 is configured as a p-type device (for example, having a p-channel), epitaxial source/drain features 248 are silicon germanium (SiGe) layers, where the SiGe layers are doped with boron, other p-type dopant, or combinations thereof (for example, forming a Si:Ge:B epitaxial layer). In some implementations, epitaxial source/drain features 248 include materials and/or dopants that achieve desired tensile stress and/or compressive stress in channel region 206. In some implementations, epitaxial source/drain features 248 are doped during deposition by adding impurities to a source material of the epitaxy process. In some implementations, epitaxial source/drain features 248 are doped by an ion implementation process subsequent to a deposition growth process. In some implementations, annealing processes are performed to activate dopants in epitaxial source/drain features 248 and/or other source/drain regions of non-volatile memory device 200 (for example, heavily doped source/drain regions and/or lightly doped source/drain (LDD) regions).

An inter-level dielectric (ILD) layer 250 can be formed over substrate 202, for example, by a deposition process (such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof). ILD layer 250 includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In the depicted embodiment, ILD layer 250 is a low-k dielectric layer. In some implementations, ILD layer 250 can include a multilayer structure having multiple dielectric materials. Subsequent to the deposition of ILD layer 250, a chemical mechanical polishing (CMP) process may be performed, such that a top portion of gate structure 235 is reached (exposed), particularly, a top portion of gate electrode 280.

In FIGS. 7-14, a gate replacement process is performed to replace a dummy gate (here, dummy gate electrode 240) of gate structure 235 with a gate, such as a metal gate stack. During the gate replacement process, heterostructure 205 can be processed using horizontal gate-all-around (GAA) processing technologies, fin-like field effect transistor (FinFET) technologies, and/or channel-on-oxide transistor technologies to fabricate at least one nanocrystal floating gate (also referred to as a charge storing nanocrystal) disposed above and/or between at least one nanowire channel. In some implementations, heterostructure 205 is processed to fabricate a nanowire disposed between nanocrystal floating gates, improving threshold voltage control (programmability) of the nanowire. Further, by fabricating nanocrystal floating gates during the gate replacement process, nanocrystal floating gates automatically self-align between a source and a drain (such as source region 207 and drain region 208), and further automatically self-align between a channel (such as a nanowire channel) and a control gate. Accordingly, fabricating nanocrystal floating gates is easily and cost-effectively integrated into existing fabrication processes. Different embodiments may have different advantages, and no particular advantage is necessarily required of any embodiment.

Figure 7:
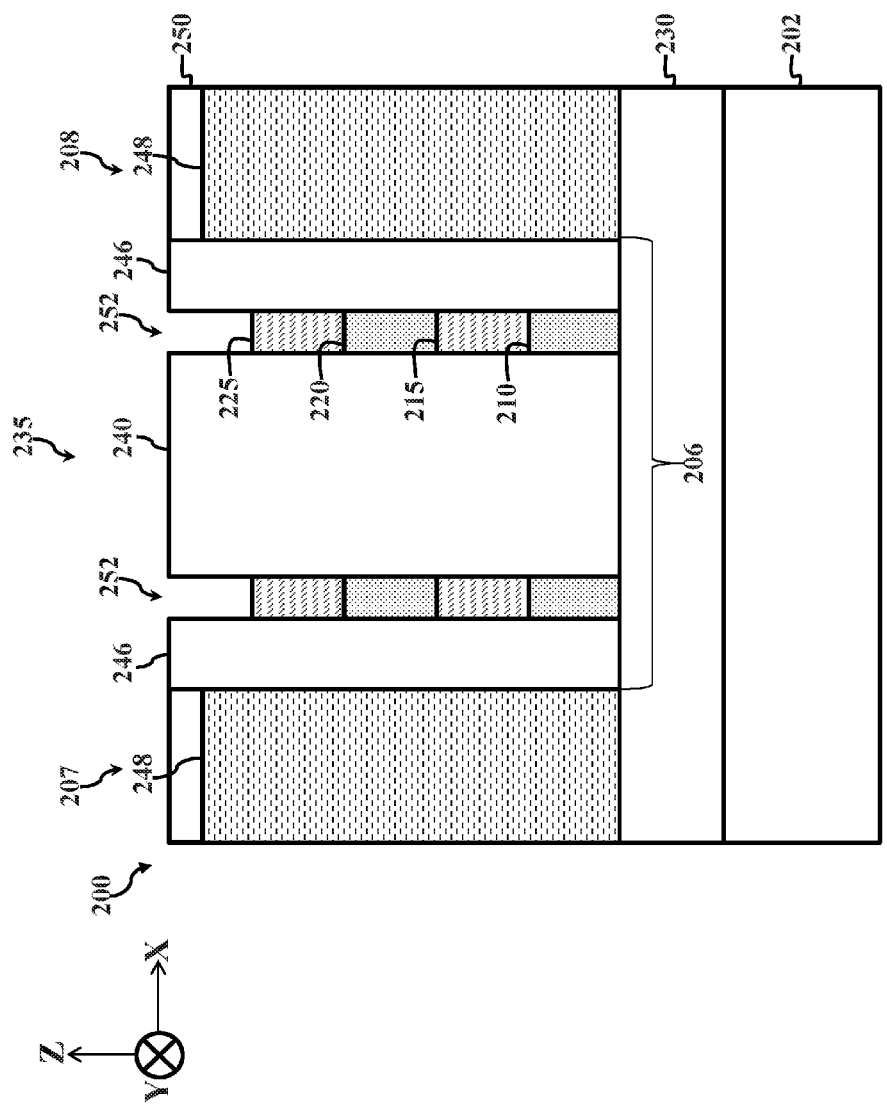

In FIG. 7, a portion of gate structure 235 is removed to expose portions of heterostructure 205. In some implementations, an etching process (for example, a selective wet etching process) removes sacrificial gate spacers 244 to form openings 252 within gate structure 235 that expose portions of heterostructure 205 in channel region 206, such as portions of semiconductor layer 210, semiconductor layer 215, semiconductor layer 220, and semiconductor layer 225 disposed between dummy gate electrode 240 and gate spacers 246. The etching process is a dry etching process, a wet etching process, or combinations thereof. In some implementations, due to a high etch rate of the material of sacrificial gate spacers 244 relative to the material of gate spacers 246, the etching process can remove sacrificial gate spacers 244 while eliminating or minimizing any removal of gate spacers 246. Various etching parameters can be tuned to selectively etch sacrificial gate spacers 244, such as etchant composition, etching temperature, etching solution concentration, etching time, etching pressure, source power, radio frequency (RF) bias voltage, RF bias power, etchant flow rate, other suitable etching parameters, or combinations thereof. In some implementations, sacrificial gate spacers 244 may be etched using etch reactants having a high etch selectivity with respect to the material of sacrificial gate spacers 244. For example, in implementations where sacrificial gate spacers 244 include silicon oxide, a wet etching process using a hydrofluoric acid solution can selectively etch sacrificial gate spacers 244 without etching gate spacers 246. In another example, in implementations where sacrificial gate spacers 244 include silicon nitride, a wet etching process using a phosphoric acid solution can selectively etch sacrificial gate spacers 244 without etching gate spacers 246.

Figure 8:
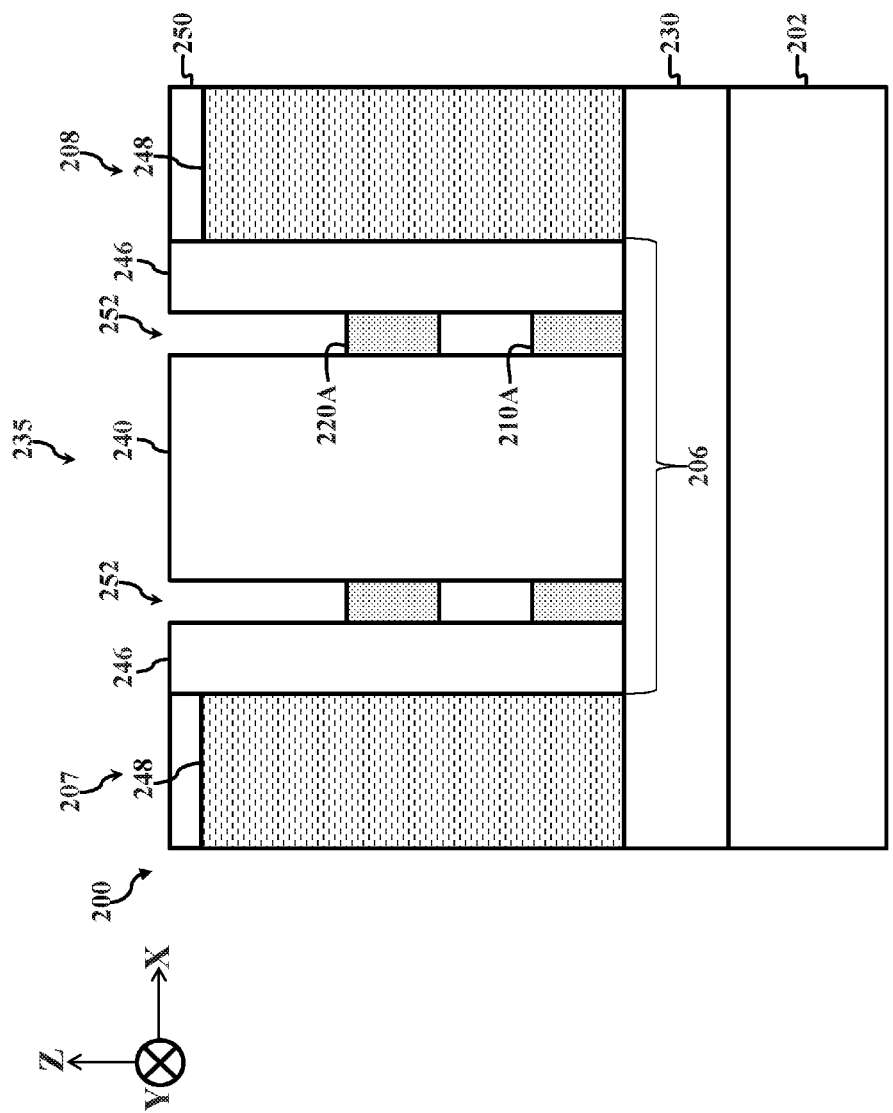

In FIG. 8, portions of heterostructure 205 are selectively removed to form nanowires. For example, exposed semiconductor layer 215 and semiconductor layer 225 are selectively etched within channel region 206, such that a nanowire 210A and a nanowire 220A are formed in channel region 206. The etching process is a dry etching process, a wet etching process, or combinations thereof. In some implementations, where heterostructure 205 alternates between first semiconductor layers and second semiconductor layers having different materials, an etching process selectively removes the second material layers. For example, in some implementations, due to a high etch rate of the material of semiconductor layer 215 and semiconductor layer 225 relative to the material of semiconductor layer 210 and semiconductor layer 220, the etching process can remove exposed portions of semiconductor layer 215 and semiconductor layer 225 while eliminating or minimizing any removal of exposed portions of semiconductor layer 210 and semiconductor layer 220. Various etching parameters can be tuned to selectively etch semiconductor layer 215 and semiconductor layer 225, such as etchant composition, etching temperature, etching solution concentration, etching time, etching pressure, source power, RF bias voltage, RF bias power, etchant flow rate, other suitable etching parameters, or combinations thereof. In some implementations, semiconductor layer 215 and semiconductor layer 225 may be etched using etch reactants having a high etch selectivity with respect to the material of semiconductor layer 210 and semiconductor layer 220. For example, in some implementations, a dry etching process (such as a reactive ion etching (RIE) process) utilizing a fluorine-containing gas (for example, $SF_6$) can selectively etch semiconductor layer 215 and semiconductor layer 225. In some implementations, a ratio of the fluorine-containing gas to an oxygen-containing gas (for example, $O_2$), an etching temperature (for example, above or below about 80° C.), and/or an RF power may be tuned to selectively etch silicon germanium or silicon. In another example, in some implementations, a wet etching process utilizing an etching solution that includes $NH_4OH$, $H_2O_2$ and $H_2O$ can selectively etch semiconductor layer 215 and semiconductor layer 225.

Figure 8A:
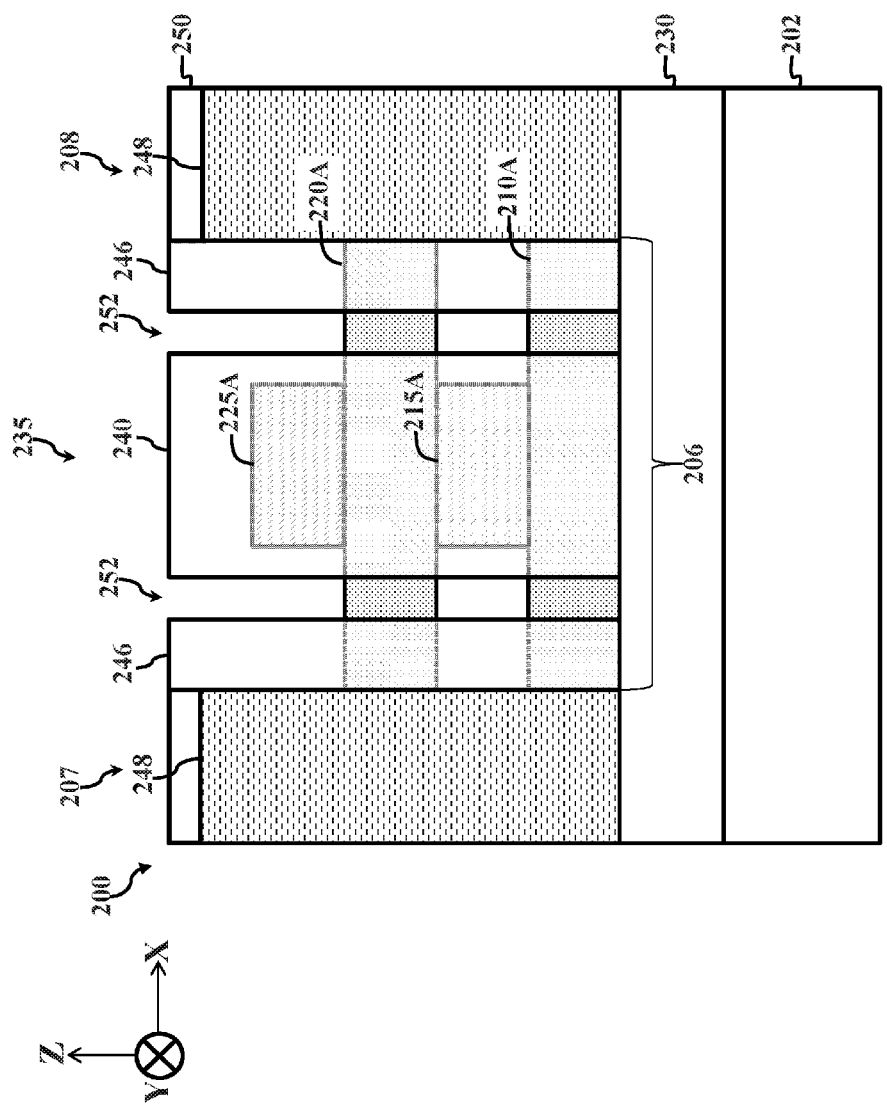

In FIG. 8A, dummy gate electrode 240 and gate spacers 246 are partially transparent, revealing that nanowire 210A and nanowire 220A extend horizontally between source region 207 and drain region 208, such that nanowire 210A and nanowire 220A constitute channels of non-volatile memory device 200. As further depicted in FIG. 8A, remaining portions of semiconductor layer 215 and semiconductor layer 225, which underlie dummy gate electrode 240, form a semiconductor island 215A (also referred to as nanocrystal 215A) disposed over nanowire 210A and a semiconductor island 225A (also referred to as nanocrystal 225A) disposed over nanowire 220A. In implementations where semiconductor layer 210 and semiconductor layer 220 are silicon layers and semiconductor layer 215 and semiconductor layer 225 are silicon germanium layers, nanowire 210A and nanowire 220A are silicon channels, and semiconductor island 215A and semiconductor island 225A are silicon germanium nanocrystals disposed over silicon channels. The etching process may also remove portions of semiconductor layer 215 and semiconductor layer 225 underlying dummy gate electrode 240, such that a width of semiconductor island 215A and semiconductor island 225A is less than a width of dummy gate electrode 240 as depicted in FIG. 8A. Though nanowire 210A, nanowire 220A, semiconductor island 215A, and semiconductor island 225A have rectangular shapes, the present disclosure contemplates nanowire 210A, nanowire 220A, semiconductor island 215A, and semiconductor island 225A having any configuration, shape, and/or size (including cylindrical, triangular, hexagonal, trapezoidal, or other desired shapes) depending on design requirements of non-volatile memory device 200.

Figure 9:
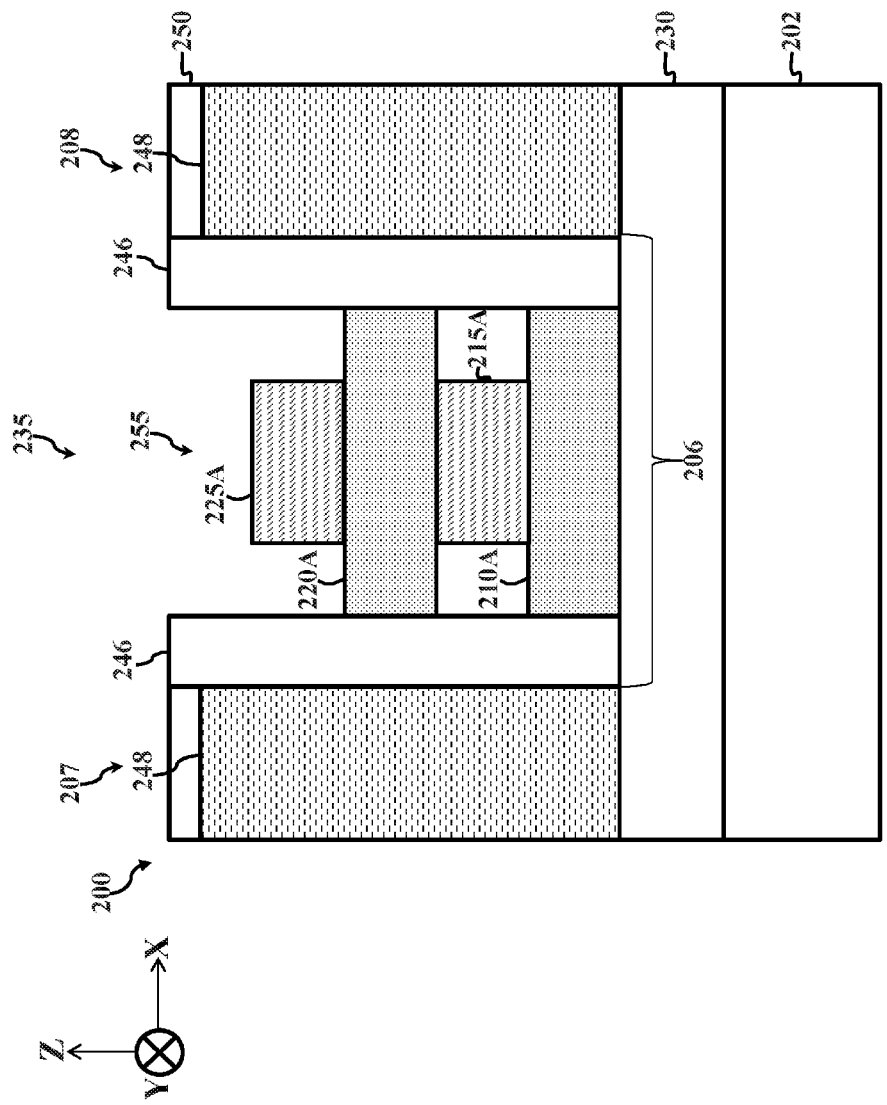

In FIG. 9, the dummy gate stack of gate structure 235 (here, dummy gate electrode 240) is removed, thereby forming a trench (opening) 255. Opening 255 exposes a portion of channel region 206, and in particular, exposes nanowire 210A, semiconductor island 215A, nanowire 220A, and semiconductor island 225A in channel region 206. The dummy gate stack is removed using any suitable process. In some implementations, an etching process selectively removes dummy gate electrode 240 (and, in some implementations, the dummy gate dielectric). The etching process is a dry etching process, a wet etching process, or combinations thereof. A selective etching process (such as a selective wet etch and/or a selective dry etch) can be tuned as described herein, such that dummy gate electrode 240 has an adequate etch rate relative to gate spacers 246 and other device features in opening 255 (for example, nanowire 210A, semiconductor island 215A, nanowire 220A, and semiconductor island 225A).

Figure 10:
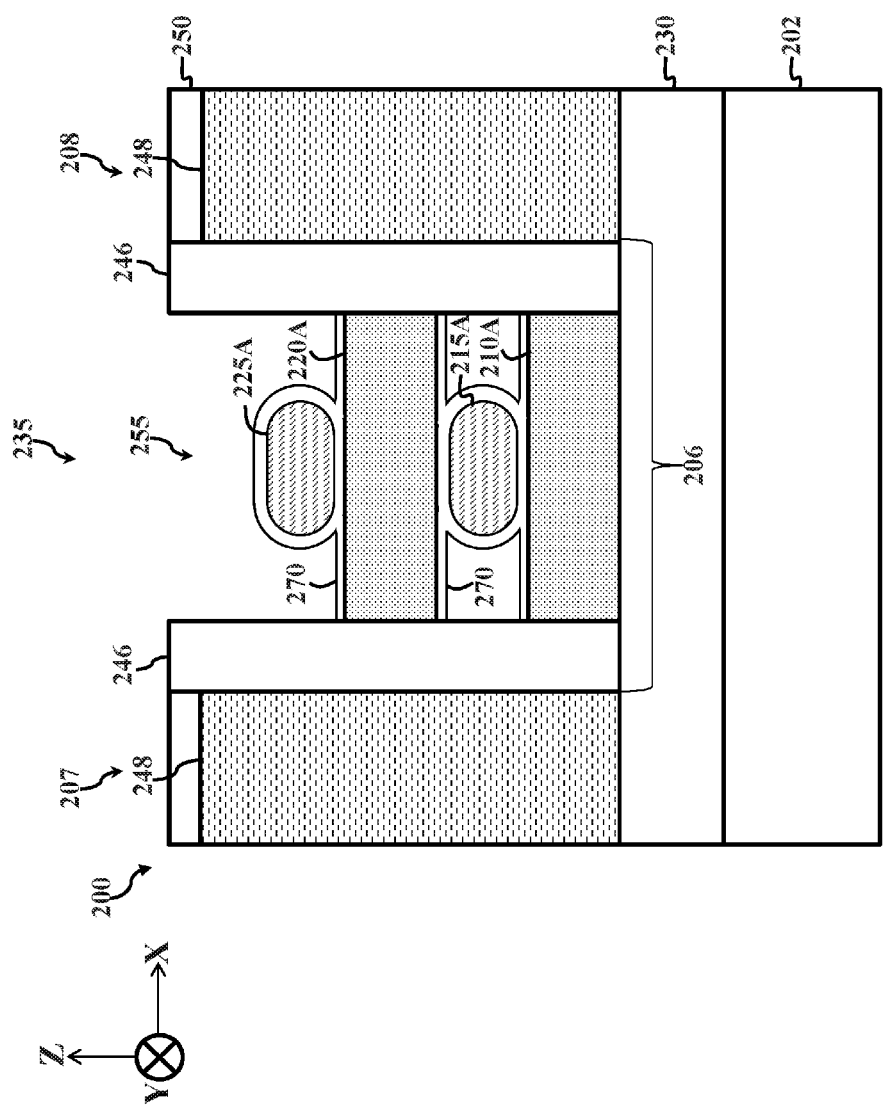

In FIG. 10, an oxide layer 270 is formed over exposed portions of channel region 206. For example, oxide layer 270 is formed over nanowire 210A, semiconductor island 215A, nanowire 220A, and semiconductor island 225A. In some implementations, oxide layer 270 is a semiconductor oxide layer, such as a silicon oxide layer. Portions of nanowire 210A, semiconductor island 215A, nanowire 220A, and semiconductor island 225A can be oxidized to form oxide layer 270. For example, in some implementations, a thermal oxidation process is performed on nanowire 210A, semiconductor island 215A, nanowire 220A, and semiconductor island 225A. An oxidation rate of semiconductor island 215A and semiconductor island 225A (in some implementations, silicon germanium islands) is higher than an oxidation rate of nanowire 210A and nanowire 220A (in some implementations, silicon nanowires), such that greater portions of semiconductor island 215A and semiconductor island 225A are consumed during the thermal oxidation process. Accordingly, a thickness of oxide layer 270 on semiconductor island 215A and semiconductor island 225A is greater than a thickness of oxide layer 270 on nanowire 210A and nanowire 220A. The thermal oxidation process is conducted in an oxygen ambient, a steam ambient, other suitable ambient, or combinations thereof. In some implementations, the thermal oxidation process is a wet oxidation process. In some implementations, the thermal oxidation process is tuned to achieve higher oxidation rates of semiconductor layer 215 and semiconductor layer 225, for example, by performing the thermal oxidation process at a temperature less than about 900° C.

Figure 11:
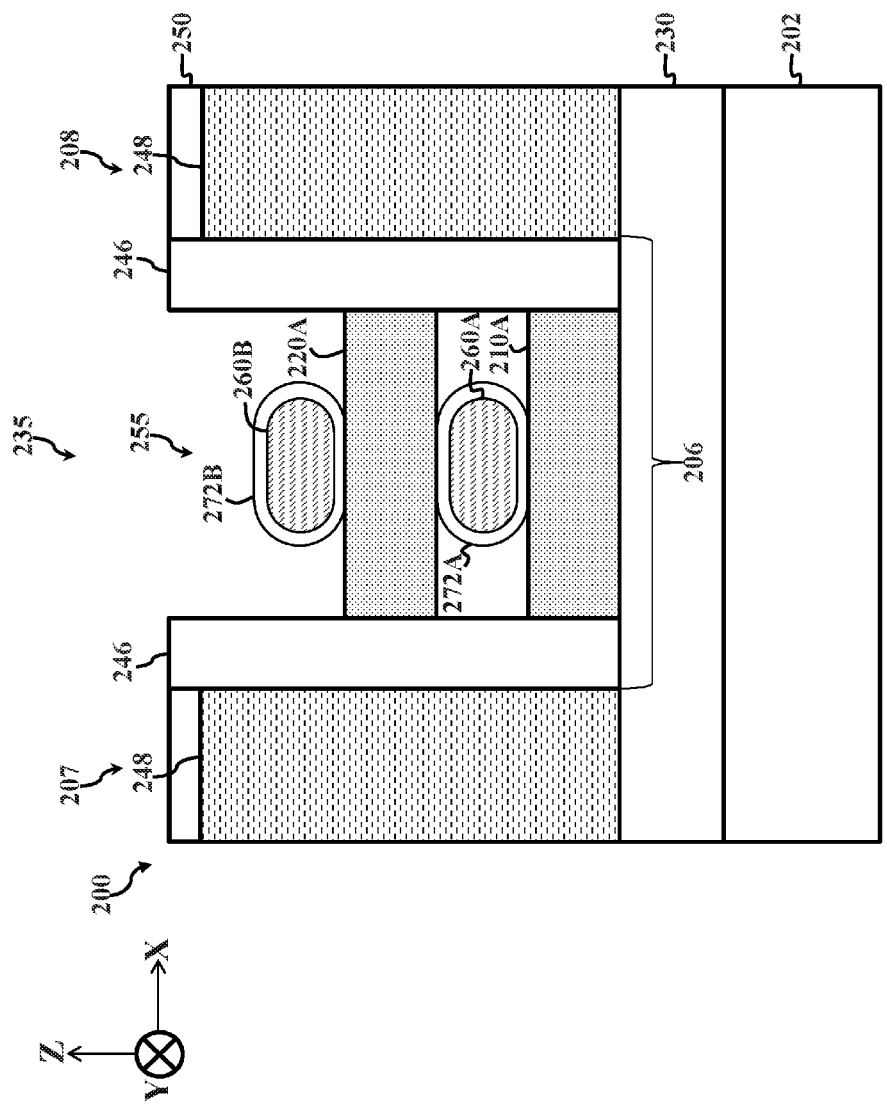

In FIG. 11, portions of oxide layer 270 are removed, forming nanocrystal floating gates of non-volatile memory device 200. For example, oxide layer 270 is removed from nanowire 210A and nanowire 220A using an etching process, such that a nanocrystal floating gate 260A (which is a remaining portion of semiconductor island 215 after various processing, such as the described etching and oxidation processes) is surrounded by a tunnel oxide layer 272A and a nanocrystal floating gate 260B (which is a remaining portion of semiconductor island 225 after various processing, such as the described etching and oxidation processes) is surrounded by a tunnel oxide layer 272B. The etching process is a dry etching process, a wet etching process, or combination thereof. In some implementations, a wet etching process is tuned (for example, by controlling etching time) to ensure that oxide layer 270 is sufficiently removed from nanowire 210A and nanowire 220A. Nanocrystal floating gate 260A serves as a lower floating gate and nanocrystal floating gate 260B serves as an upper floating gate. In the depicted embodiment, nanocrystal floating gate 260A and nanocrystal floating gate 260B have cylindrical shapes, though the present disclosure contemplates nanocrystal floating gate 260A and nanocrystal floating gate 260B having any configuration, shape, and/or size (including rectangular, triangular, hexagonal, trapezoidal, or other desired shapes) depending on design requirements of non-volatile memory device 200. As depicted in FIG. 11, tunnel oxide layer 272A surrounds nanocrystal floating gate 260A, and tunnel oxide layer 272B surrounds nanocrystal floating gate 260B, and nanocrystal floating gate 260A and nanocrystal floating gate 260B are vertically self-aligned over nanowire 210A and nanowire 220A.

Figure 12:
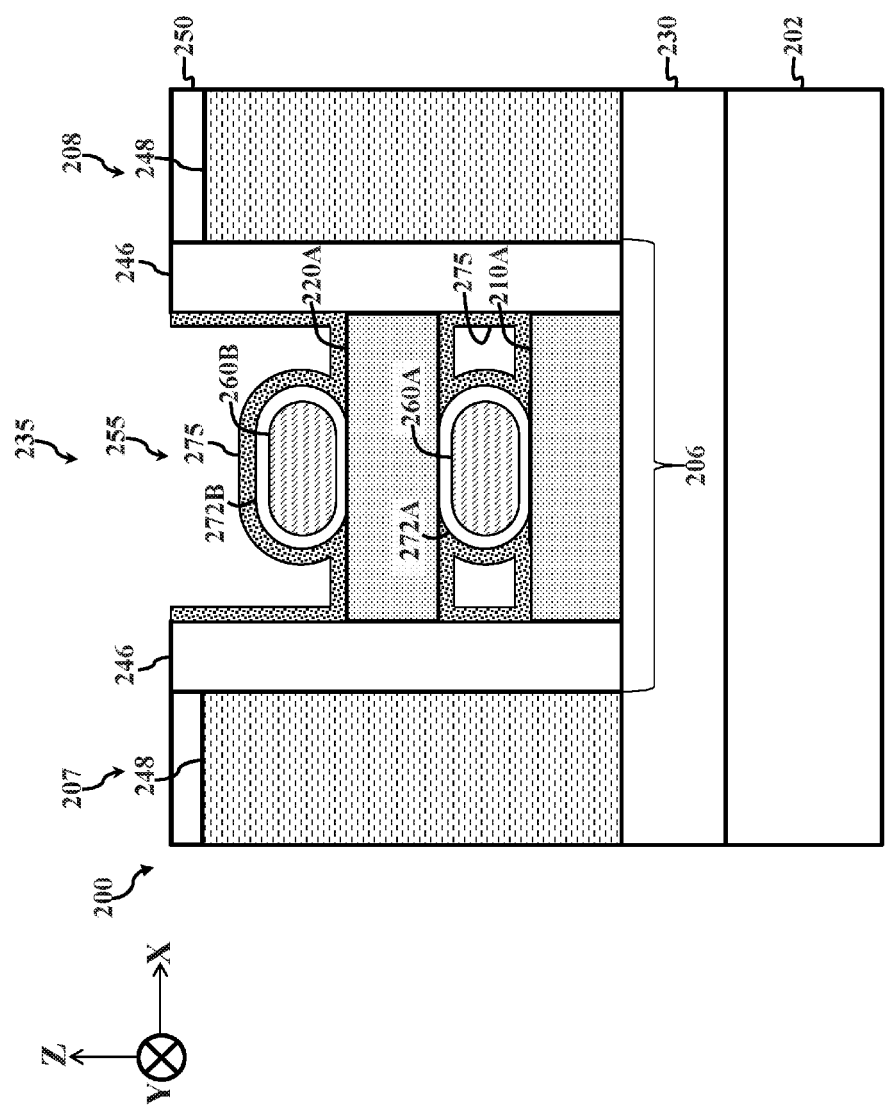
Figure 13:
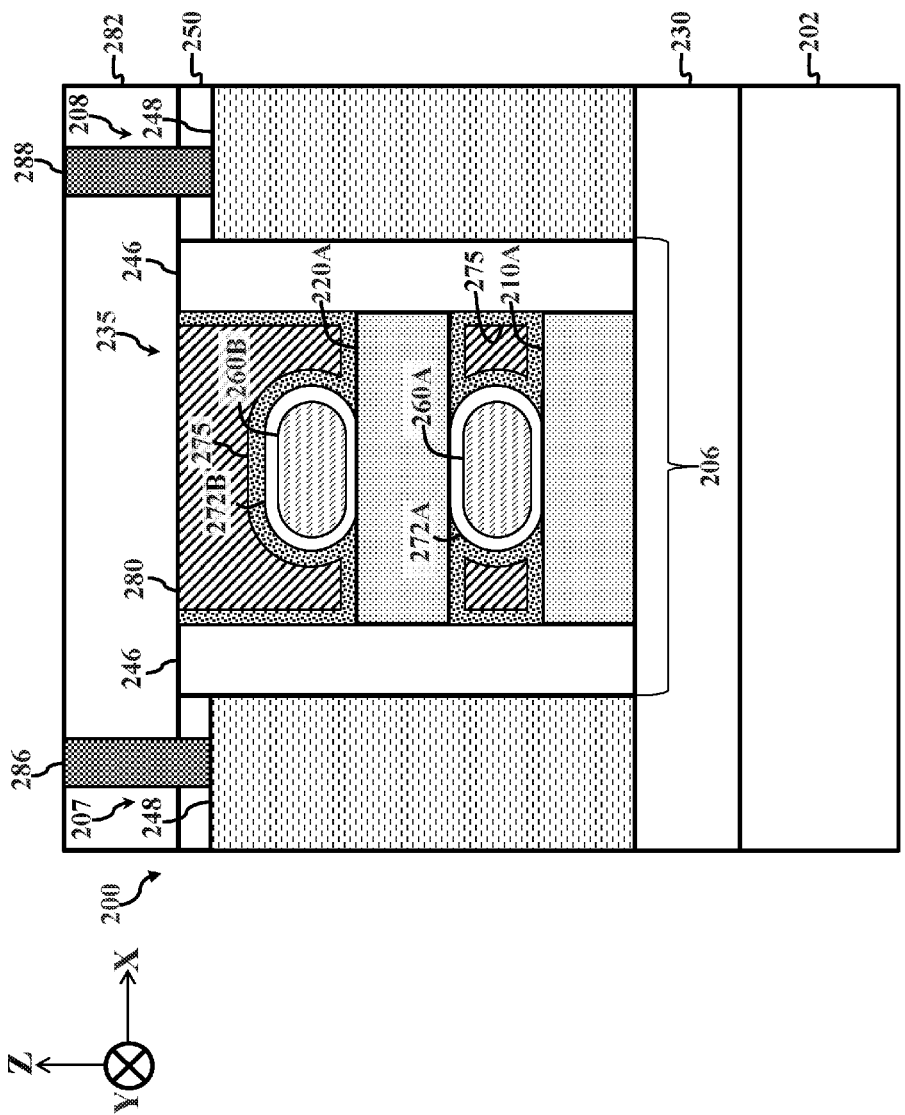
Figure 14:
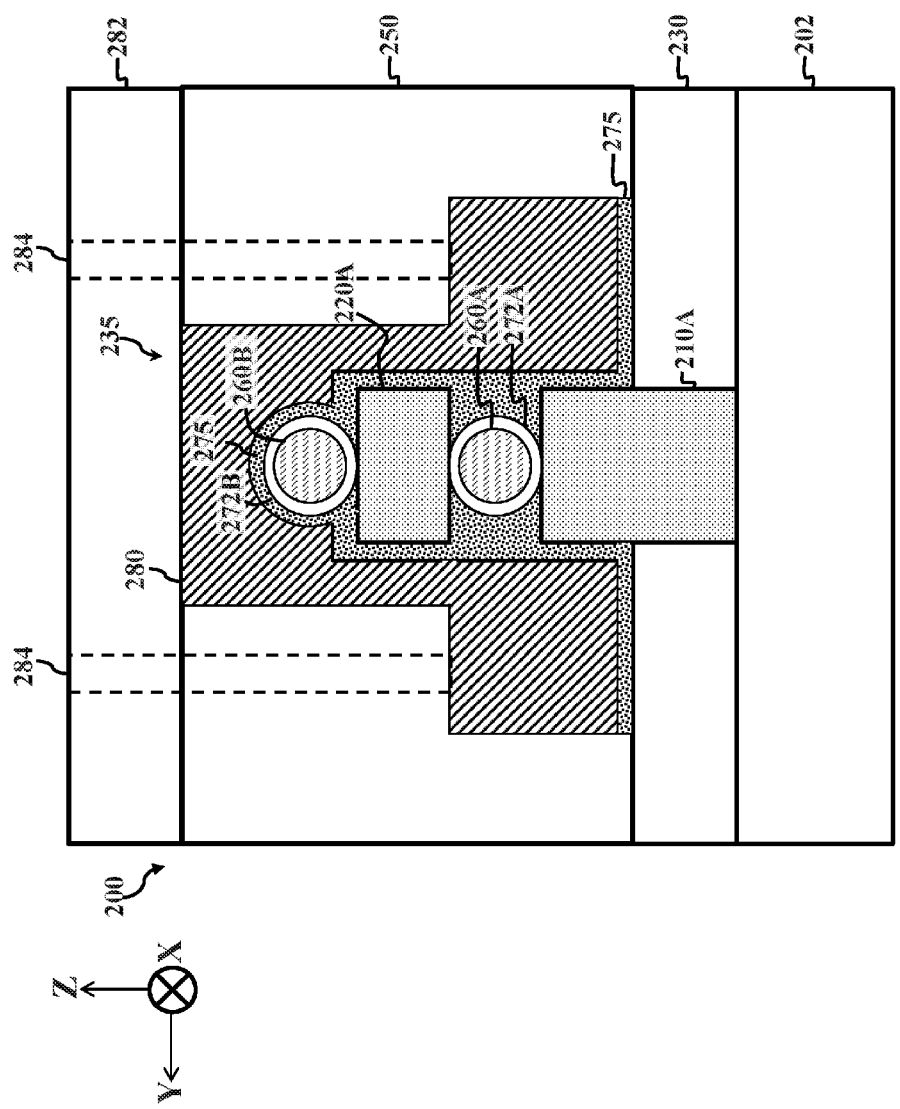

In FIG. 12 and FIG. 13, a metal gate stack of gate structure 235 is formed in opening (trench) 255. FIG. 14 depicts non-volatile memory device 200 at the same fabrication stage as FIG. 13 (after forming the metal gate stack of gate structure 235), with non-volatile memory device 200 viewed in the Y-Z plane (perpendicular to a channel direction, which extends in the x-direction). The metal gate stack includes a gate dielectric 275 and a gate electrode 280. The metal gate stack constitutes a control gate of non-volatile memory device 200. The metal gate stack of gate structure 235 may include numerous other layers, for example, capping layers, interface layers, diffusion layers, barrier layers, hard mask layers, or combinations thereof. In FIG. 12, gate dielectric 275 is formed over exposed portions of non-volatile memory device 200 in opening 255. For example, gate dielectric 275 conforms to exposed surfaces of opening 255, including exposed surfaces of nanowire 210A and nanowire 220A, exposed surfaces of gate spacers 246, and exposed surfaces of tunnel oxide layer 272A and tunnel oxide layer 272B. In FIG. 13, gate electrode 280 is formed over gate dielectric 275. Gate dielectric 275 and gate electrode 280 are formed by various deposition processes. In some implementations, an atomic layer deposition (ALD) process deposits a gate dielectric layer over exposed surfaces in opening 255, and an ALD process deposits a gate electrode layer over the gate dielectric layer. The gate dielectric layer and the gate electrode layer may conform to the exposed surfaces in opening 255, providing gate dielectric 275 and gate electrode 280 as depicted. A CMP process can be performed to remove excess gate electrode layer, planarizing the metal gate stack.

Gate dielectric 275 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, gate dielectric 275 is a high-k dielectric layer. In some implementations, gate dielectric 275 includes an interfacial layer (such as a silicon oxide layer), and a high-k dielectric layer disposed over the interfacial layer. Gate electrode 280 includes a conductive material, such as polysilicon, Al, Cu, Ti, Ta, W, Mo, TaN, NiSi, CoSi, TiN, WN, TiAl, TiAlN, TaCN, TaC, TaSiN, other conductive material, or combinations thereof. In some implementations, gate electrode 280 includes a work function layer, which is a conductive layer tuned to have a desired work function (such as an n-type work function or a p-type work function), and a conductive layer formed over the work function layer. In various examples, the work function layer includes Ta, TaN, NiSi, CoSi, TiN, WN, TiAl, TiAlN, TaCN, TaC, TaSiN, other material suitable for achieving a desired work function, or combinations thereof. The conductive layer formed over the work function layer includes a suitable conductive material, such as aluminum, tungsten, or copper. The conductive layer may additionally or collectively include polysilicon, titanium, tantulum, metal alloys, other suitable materials, or combinations thereof. In some implementations, silicide features are formed in gate regions and/or source/drain regions. For example, silicide features can be formed over epitaxial on source/drain features 248 and additionally on gate electrode 280 when gate electrode 280 includes polysilicon. The silicide features are formed by a silicidation process, such as a self-aligned silicide (salicide) process.

Various contacts are formed to facilitate operation of non-volatile memory device 200. In FIG. 13 and FIG. 14, an ILD layer 282, similar to ILD layer 250, can be formed over substrate 202 (in the depicted embodiment, over ILD layer 250 and gate structure 235). Contacts can be formed in ILD layer 250 and/or ILD layer 282. For example, a contact 284 is electrically coupled with a control gate of non-volatile memory device 200 (particularly gate electrode 280), a contact 286 is electrically coupled to source region 207 (particularly epitaxial source/drain feature 248), and a contact 288 is electrically coupled to drain region 208 (particularly epitaxial source/drain feature 248). Contacts 284, 286, and 288 include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layer 250, ILD layer 282, contact 284, contact 286, and/or contact 288 are a portion of a multilayer interconnect (MLI) feature disposed over substrate 202. The MLI feature electrically couples various components of non-volatile memory device 200, such that the various components are operable to function as specified by design requirements of non-volatile memory device 200. In some implementations, the MLI includes at least one bit line, at least one word line, at least one source line, and/or at least one erase line. In some implementations, contact 284 is electrically coupled with a word line, contact 286 is electrically coupled with a source line, and contact 288 is electrically coupled with a bit line. Contact 284, contact 286, and contact 288 may be considered a portion of the respective word line, source line, and bit line. The MLI feature can include a combination of metal layers and ILD layers configured to form vertical interconnect features, such as contacts and/or vias, and/or horizontal interconnect features, such as lines. The various conductive features include materials similar to contacts 284, 286, and 288. In some implementations, a damascene process and/or dual damascene process is used to form a copper-based multilayer interconnection structure. Nonvolatile memory device 200 can undergo subsequent processing to complete fabrication.

In FIG. 13 and FIG. 14, non-volatile memory device 200 is configured with a horizontal gate-all-around transistor, which includes horizontally stacked nanowires having nanocrystal floating gates disposed between and/or above the nanowires. For example, nanowire 220A is disposed between nanocrystal floating gate 260A and nanocrystal floating gate 260B, where nanocrystal floating gate 260A is disposed over nanowire 210A and nanocrystal floating gate 260B is disposed over nanowire 210B. Gate structure 235 (in particular, the metal gate stack including gate dielectric 275 and gate electrode 280) substantially surrounds nanocrystal floating gate 260A and nanocrystal floating gate 260B. However, nanocrystal floating gate 260A and nanocrystal floating gate 260B are isolated from gate electrode 280 (a control electrode) by gate dielectric 275 and respective tunnel oxide layer 272A and tunnel oxide layer 272B, such that nanocrystal floating gate 260A and nanocrystal floating gate 260B can store electrical charge (electrons or holes). Nanocrystal floating gate 260A and nanocrystal floating gate 260B are thus also referred to as charge storing (or storage) nanocrystals. By implementing nanocrystal floating gates above and below nanowire 220A (here, nanocrystal floating gate 260B and nanocrystal floating gate 260A, respectively), a programmable threshold voltage in nanowire 220A is better controlled during operation, particularly when compared to non-volatile memory devices that implement a single nanocrystal floating gate above (or below) a nanowire. By fabricating nanocrystal floating gate 260A and nanocrystal floating gate 260B during the gate replacement process, nanocrystal floating gate 260A and nanocrystal floating gate 260B are self-aligned between source region 207 and drain region 208, and are further self-aligned between the metal gate stack (in particular, the control gate provided by gate dielectric 275 and gate electrode 280) and nanowire 220A (which provides a nanowire channel). Furthermore, In some implementations (such as depicted in FIG. 13 and FIG. 14), by fabricating nanocrystal floating gate 260A and nanocrystal floating gate 260B during the gate replacement process, nanocrystal floating gate 260A and nanocrystal floating gate 260B are generally cigar-shaped. In such implementations, nanocrystal floating gate 260A and nanocrystal floating gate 260B have a length (in the x-direction) that is greater than a height (in the z-direction) and a width (in the y-direction). In some implementations, nanocrystal floating gate 260A and nanocrystal floating gate 260B have a generally oval-shaped cross-section in the X-Z plane and a generally circle-shaped cross-section in the Y-Z plane.

In operation, biasing heterostructure 205 (specifically source region 207 and drain region 208) and gate structure 235 (specifically gate electrode 280) via contacts 284, 286, and/or 288 causes nanocrystal floating gate 260A and/or nanocrystal floating gate 260B to charge/discharge electrons (or holes), such that one bit of data may be written to, read from, or erased from nanocrystal floating gate 260A and nanocrystal floating gate 260B. In some implementations, non-volatile memory device 200 is configured with additional nanocrystal floating gates, such that non-volatile memory device 200 can store more than one bit of information. When a bit is written to, a negative charge (electron) is placed on nanocrystal floating gate 260A and/or nanocrystal floating gate 260B. When a bit is erased, charge is removed from the bit, returning nanocrystal floating gate 260A and/or nanocrystal floating gate 260B to an uncharged state. Charging/discharging nanocrystal floating gate 260A and nanocrystal floating gate 260B modifies a threshold voltage of nanowire 210A and/or nanowire 220A, such that non-volatile memory device 200 can achieve two different logic states. In some implementations, nanocrystal floating gate 260A and nanocrystal floating gate 260B yield a lower threshold voltage when charged and a higher threshold voltage when uncharged. In some implementations, non-volatile memory device 200 operates as a flash memory.

During write operations and erase operations, non-volatile memory device 200 can utilize Fowler-Nordheim ("FN") tunneling of electrons (or holes) from nanowire 210A and/or nanowire 220A through tunnel oxide layer 272A and tunnel oxide layer 272B to nanocrystal floating gate 260A and nanocrystal floating gate 260B. For example, a write operation is achieved by grounding source region 207 and drain region 208 via respective contact 286 and contact 288 and applying a positive voltage (for example, 5 volts) to gate electrode 280 via contact 284. A positive potential on gate electrode 280 effects FN tunneling of electrons from nanowire 210A and/or nanowire 220A through tunnel oxide layer 272A and/or tunnel oxide layer 272B to nanocrystal floating gate 260A and/or nanocrystal floating gate 260B. The negative charge on nanocrystal floating gate 260A and nanocrystal floating gate 260B modifies (for example, increases) a threshold voltage of nanowire 210A and/or nanowire 220A, such that a logical zero (0) can be read from non-volatile memory device 200. In another example, an erase operation is achieved by applying a positive voltage (for example, 5 volts) to source region 207 and drain region 208 via respective contact 286 and contact 288 and grounding gate electrode 280 via contact 284. A positive potential on source region 207 and drain region 208 effects FN tunneling of electrons from nanocrystal floating gate 260A and/or nanocrystal floating gate 260B through tunnel oxide layer 272A and/or tunnel oxide layer 272B to nanowire 210A and/or nanowire 220A. The lack of charge on nanocrystal floating gate 260A and nanocrystal floating gate 260B modifies (decreases) a threshold voltage of nanowire 210A and/or nanowire 220A, such that a logical one (1) can be read from non-volatile memory device 200.

Figure 15A:
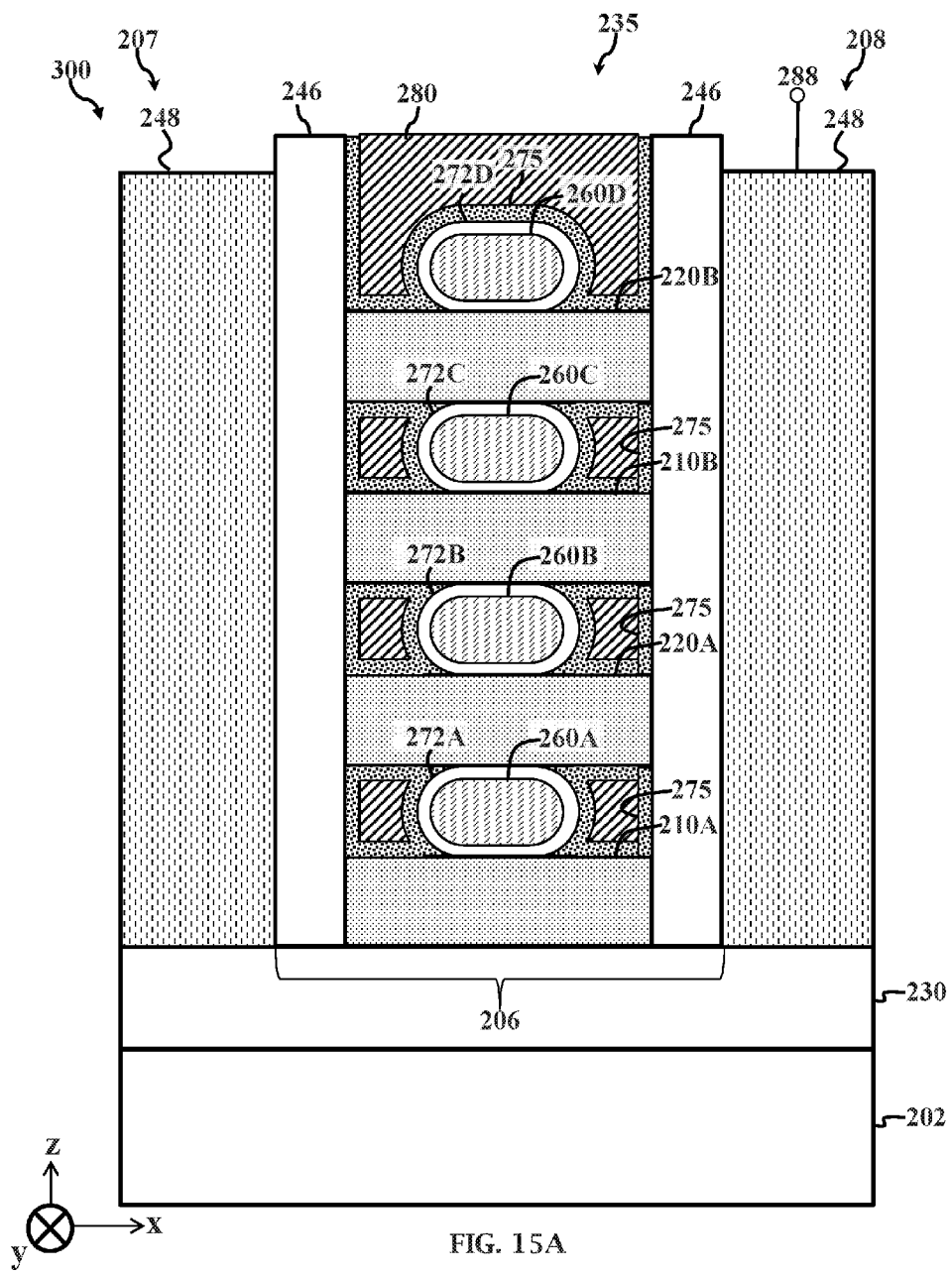
FIG. 15A and FIG. 15B are fragmentary diagrammatic cross-sectional views of another non-volatile memory device, in portion or entirety, which can be fabricated according to the method of FIG. 1.
Figure 15B:
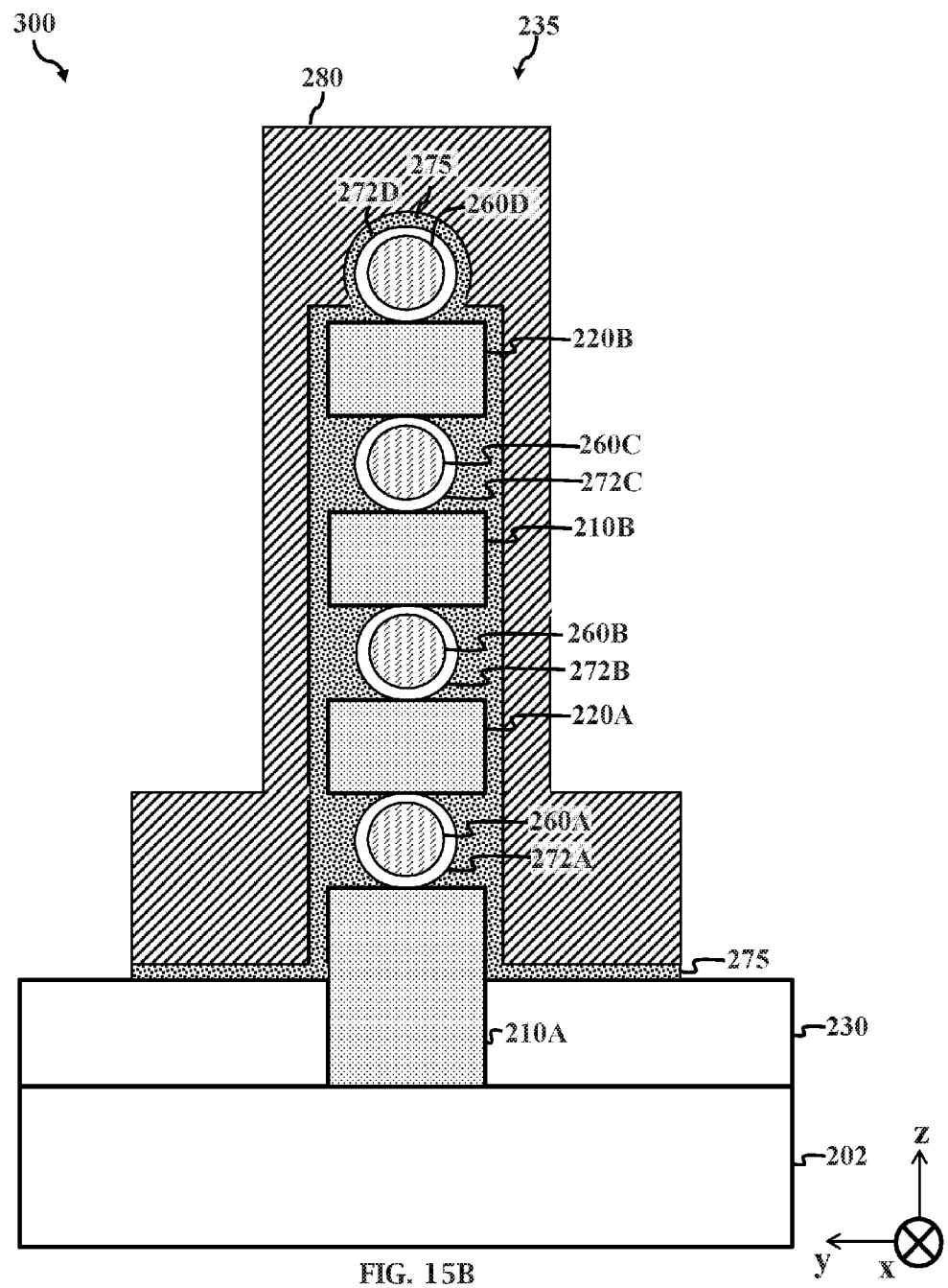

FIG. 15A and FIG. 15B are fragmentary diagrammatic cross-sectional views of an integrated circuit device that includes a non-volatile memory device 300, in portion or entirety, according to various aspects of the present disclosure. FIG. 15A depicts non-volatile memory device 300 in an X-Z plane, and FIG. 15B depicts non-volatile memory device 300 in a Y-Z plane. Non-volatile memory device 300 is similar in many respects to non-volatile memory device 200. Accordingly, similar features in FIG. 15A and FIG. 15B and FIGS. 2-14 are identified by the same reference numerals for clarity and simplicity. In FIG. 15A and FIG. 15B, non-volatile memory device 300 includes four nanowires and four nanocrystal floating gates, when compared to non-volatile memory device 200. For example, non-volatile memory device 300 further includes a nanowire 210B, a nanowire 220B, a nanocrystal floating gate 260C (surrounded by a tunnel oxide layer 272C), and a nanocrystal floating gate 220D (surrounded by a tunnel oxide layer 272D). Non-volatile memory device 300 can be fabricated using horizontal gate-all-around (GAA) processing technologies similar to non-volatile memory device 200. For example, non-volatile memory device 300 can begin with heterostructure 205 including an additional set of semiconductor layers (in particular, another semiconductor layer 210, another semiconductor layer 215, another semiconductor layer 220, and another semiconductor layer 225) disposed over semiconductor layer 225 and proceed through the fabrication processes as described with reference to FIGS. 2-14, such that nanowire 210B is fabricated from the another semiconductor layer 210, nanocrystal floating gate 260C is fabricated from the another semiconductor layer 215, nanowire 220B is fabricated from the another semiconductor layer 220, and nanocrystal floating gate 260D is fabricated from the another semiconductor layer 225. FIG. 15A and FIG. 15B have been simplified for the sake of clarity to better understand the inventive concepts of the present disclosure. Additional features can be added in non-volatile memory device 300, and some of the features described below can be replaced, modified, or eliminated in other embodiments of non-volatile memory device 300.

Figure 16A:
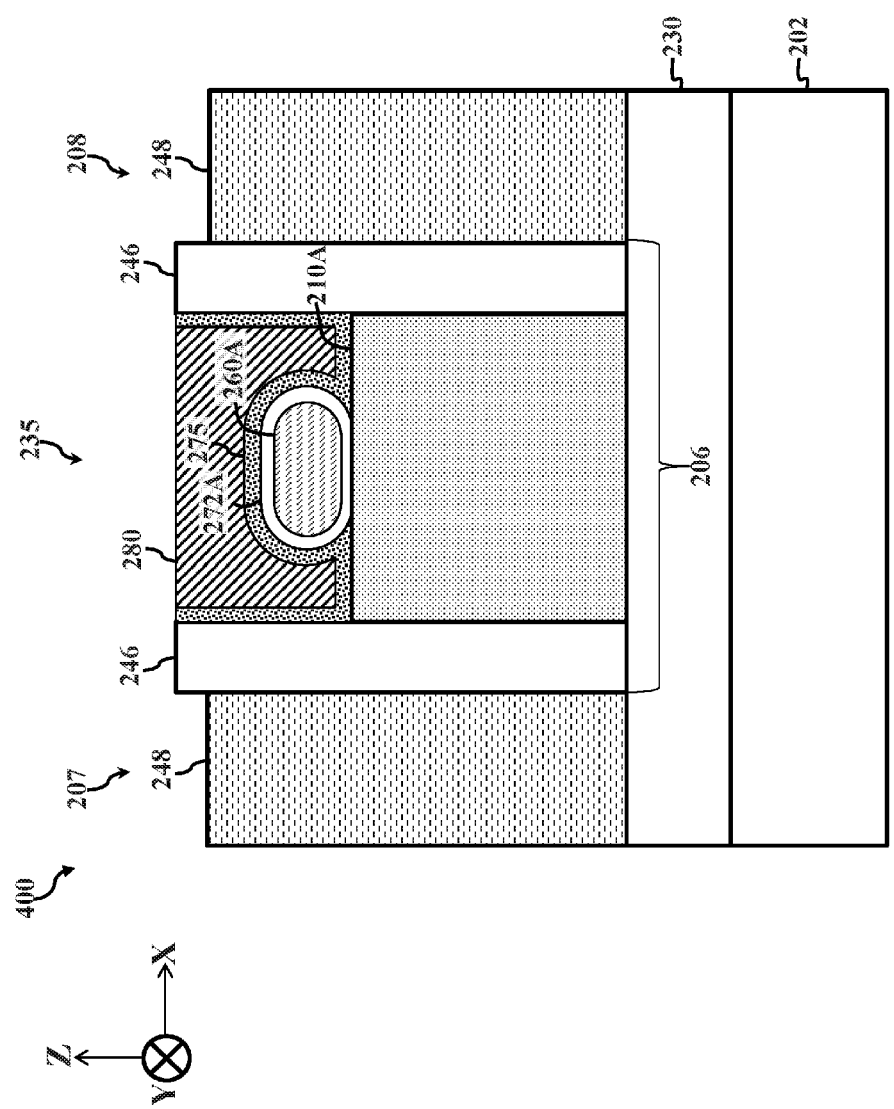

FIG. 16A and FIG. 16B are fragmentary diagrammatic cross-sectional views of an integrated circuit device that includes a non-volatile memory device 400, in portion or entirety, according to various aspects of the present disclosure. FIG. 16A depicts non-volatile memory device 400 in an X-Z plane, and FIG. 16B depicts non-volatile memory device 400 in a Y-Z plane. Non-volatile memory device 400 is similar in many respects to non-volatile memory device 200. Accordingly, similar features in FIG. 16A and FIG. 16B and FIGS. 2-14 are identified by the same reference numerals for clarity and simplicity. In FIG. 16A and FIG. 16B, non-volatile memory device 400 can be processed using fin-like field effect transistor (FinFET) processing technologies to achieve non-volatile memory device 400 having a FinFET transistor that includes a fin channel having a nanocrystal floating gate disposed thereover. For example, non-volatile memory device 400 includes nanowire 210A configured as a fin extending from substrate 202 and nanocrystal floating gate 260A disposed thereover. In such implementations, non-volatile memory device 400 can begin with heterostructure 205 including only semiconductor layer 210 and semiconductor layer 215 and proceed through the fabrication processes as described with reference to FIGS. 2-14 to achieve non-volatile memory device 400 as depicted. In some implementations, semiconductor layer 210 has an initial thickness greater than an initial thickness of semiconductor layer 215. As semiconductor layer 210 is fabricated to form a fin, the fin may be configured as nanowire 210A of non-volatile memory device 400. In some implementations, the fin is configured as a tall nanowire, for example, having a length (in the x-direction) that is much larger than a height (in the z-direction). FIG. 16A and FIG. 16B have been simplified for the sake of clarity to better understand the inventive concepts of the present disclosure. Additional features can be added in non-volatile memory device 400, and some of the features described below can be replaced, modified, or eliminated in other embodiments of non-volatile memory device 400.

Figure 17A:
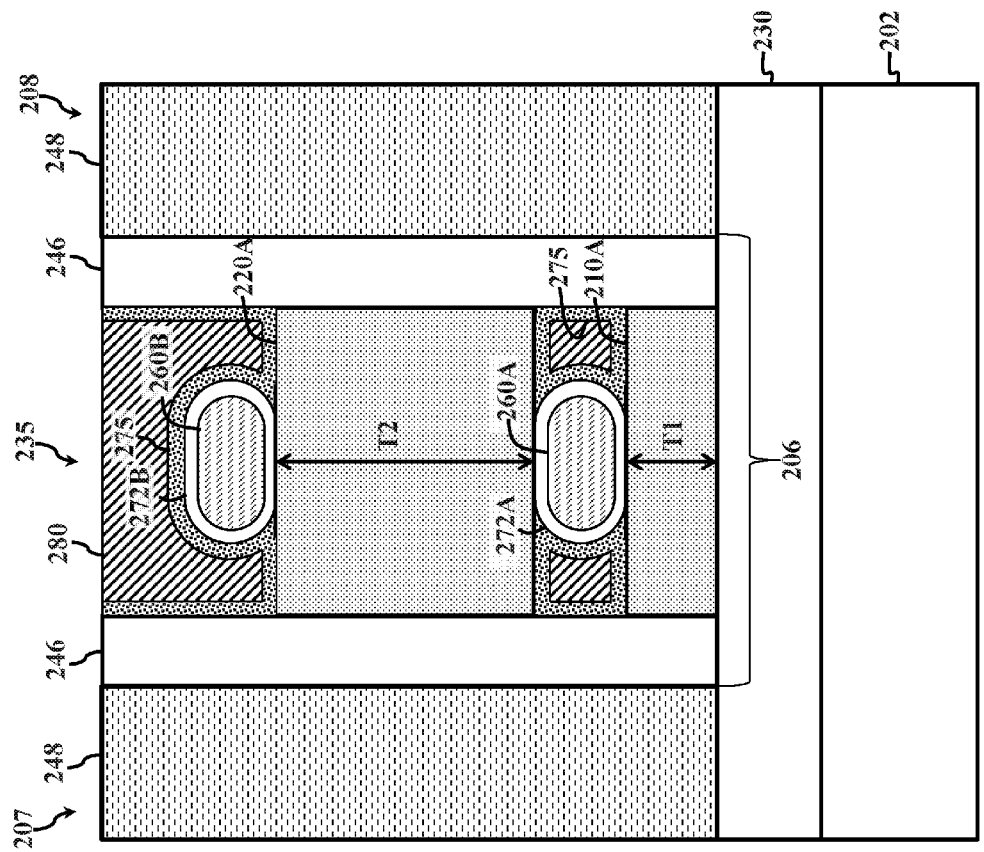
FIG. 17A and FIG. 17B are fragmentary diagrammatic cross-sectional views of yet another non-volatile memory device, in portion or entirety, which can be fabricated according to the method of FIG. 1.
Figure 17B:
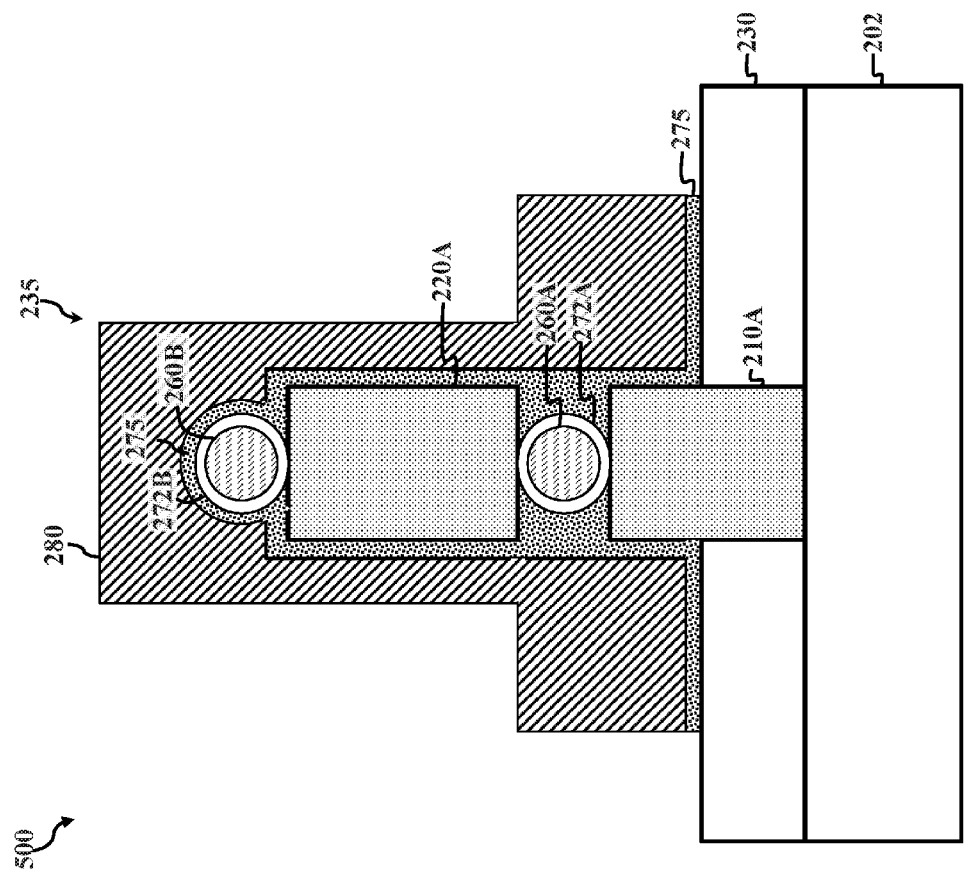
Figure 17B:
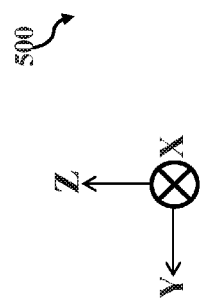

FIG. 17A and FIG. 17B are fragmentary diagrammatic cross-sectional views of an integrated circuit device that includes a non-volatile memory device 500, in portion or entirety, according to various aspects of the present disclosure. FIG. 17A depicts non-volatile memory device 500 in an X-Z plane, and FIG. 17B depicts non-volatile memory device 500 in a Y-Z plane. Non-volatile memory device 500 is similar in many respects to non-volatile memory device 200. Accordingly, similar features in FIG. 17A and FIG. 17B and FIGS. 2-14 are identified by the same reference numerals for clarity and simplicity. In FIG. 17A and FIG. 17B, non-volatile memory device 500 can be processed using channel-on-oxide processing technologies to achieve non-volatile memory device 500 having a channel-on-oxide transistor that includes a channel disposed between nanocrystal floating gates. For example, non-volatile memory device 500 includes nanowire 220A configured as a channel layer disposed between nanocrystal floating gate 260A and nanocrystal floating gate 260B, and more particularly, disposed between tunnel oxide layer 272A and tunnel oxide layer 272B. In such implementations, non-volatile memory device 500 can begin with heterostructure 205 including semiconductor layer 210 having a thickness T1 and semiconductor layer 220 having a thickness T2 (where T2 is greater than T1) and proceed through the fabrication processes as described with reference to FIGS. 2-14 to fabricate a charge storing nanocrystal above and below a channel (provided by semiconductor layer 220) of non-volatile memory device 500. As semiconductor layer 220 is fabricated to form the channel, the channel may be configured as nanowire 220A of non-volatile memory device 500. In some implementations, the channel is configured as a tall nanowire, for example, having a length (in the x-direction) that is much larger than a height (in the z-direction). FIG. 17A and FIG. 17B have been simplified for the sake of clarity to better understand the inventive concepts of the present disclosure. Additional features can be added in non-volatile memory device 500, and some of the features described below can be replaced, modified, or eliminated in other embodiments of non-volatile memory device 500.

The present disclosure provides for many different embodiments. An exemplary method for fabricating a non-volatile memory device includes forming a heterostructure over a substrate. The heterostructure includes at least one semiconductor layer pair having a first semiconductor layer and a second semiconductor layer disposed over the first semiconductor layer, the second semiconductor layer being different than the first semiconductor layer. A gate structure having a dummy gate is formed over a portion of the heterostructure, such that the gate structure separates a source region and a drain region of the heterostructure and a channel region is defined between the source region and the drain region. During a gate replacement process, a nanocrystal floating gate is formed in the channel region from the second semiconductor layer. In some implementations, during the gate replacement process, a nanowire is also formed in the channel region from the first semiconductor layer.

In some implementations, the gate structure further includes gate spacers and sacrificial gate spacers. The method can further include removing the sacrificial gate spacers to form a first opening in the gate structure that exposes a portion of the heterostructure; and removing the second semiconductor layer from the exposed portion of the heterostructure in the first opening. In some implementations, the second semiconductor layer is removed by a selective etching process, where the second semiconductor layer has a higher etch rate relative to the first semiconductor layer. In some implementations, the dummy gate is removed to form a second opening in the gate structure that exposes a remaining portion of the second semiconductor layer in the channel region. An oxide layer can be formed over the remaining portion of the second semiconductor layer. In some implementations, forming the oxide layer includes oxidizing a portion of the remaining portion of the second semiconductor layer and a portion of the first semiconductor layer exposed by the second opening; and removing the oxidized portion of the first semiconductor layer.

In some implementations, the heterostructure includes a first semiconductor layer pair and a second semiconductor layer pair disposed over the first semiconductor layer pair, the first semiconductor layer pair and the second semiconductor layer pair each having the first semiconductor layer and the second semiconductor layer. During the gate replacement process, a first nanocrystal floating gate can be formed of the second semiconductor layer in the first semiconductor layer pair, a second nanocrystal floating gate can be formed of the second semiconductor layer in the second semiconductor layer pair, and a nanowire can be formed of the first semiconductor layer of the second semiconductor layer pair. The nanowire may be disposed between the first nanocrystal floating gate and the second nanocrystal floating gate.

The gate replacement process can include forming a gate dielectric over the first semiconductor layer and the nanocrystal floating gate in the channel region, and forming a gate electrode over the gate dielectric, wherein the gate includes the gate dielectric and the gate electrode. In some implementations, the method further includes forming a control gate contact electrically coupled to the control gate, a source contact electrically coupled to the source, and a drain contact electrically coupled to the drain. In some implementations, the method further includes forming epitaxial source/drain features in the source region and the drain region of the heterostructure before the gate replacement process.

Another exemplary method for fabricating a non-volatile memory device includes forming a semiconductor layer stack over a substrate. The semiconductor layer stack includes at least one first semiconductor layer of a first semiconductor material and at least one second semiconductor layer of a second semiconductor material, the second semiconductor material being different than the first semiconductor material. The method further includes forming a gate structure over a channel region of the semiconductor layer stack. The gate structure includes a dummy gate stack, sacrificial gate spacers, and gate spacers. The sacrificial gate spacers are removed to form a first opening in the gate structure that exposes a first portion of the semiconductor layer stack in the channel region. The at least one second semiconductor layer can be removed from the exposed first portion of the semiconductor layer stack. The dummy gate stack is removed to form a second opening in the gate structure that exposes a second portion of the semiconductor layer stack in the channel region, wherein the exposed second portion includes at least one second semiconductor layer island. The method can further include forming an oxide layer over the at least one second semiconductor layer island. A metal gate stack may be formed in the second opening of the gate structure.

In some implementations, the first opening is defined between the dummy gate stack and the gate spacers, and the second opening is defined between the gate spacers. Forming the gate structure can include forming the sacrificial gate spacers adjacent to the dummy gate, wherein the sacrificial gate spacers include a first spacer material, and forming the gate spacers adjacent to the sacrificial gate spacers. The gate spacers include a second spacer material having a different etching rate than the first spacer material. Forming the metal gate stack in the second opening of the gate structure can include forming a gate dielectric over the first semiconductor layer in the exposed second portion of the semiconductor layer stack and the oxide layer, and forming a gate electrode over the gate dielectric.

In some implementations, the oxide layer is formed by oxidizing portions of the at least one second semiconductor layer island, such that the at least one second semiconductor layer island is surrounded by the oxide layer. Forming the oxide layer can further includes oxidizing portions of the at least one first semiconductor layer in the exposed second portion of the semiconductor layer stack, and removing the oxidized portions of the at least one first semiconductor layer. In some implementations, the gate structure traverses the semiconductor layer stack in a manner that separates a source region and a drain region of the semiconductor layer stack, the channel region extending horizontally between the source region and the drain region. The method can further include forming epitaxial source/drain features over the semiconductor layer stack in the source region and the drain region. In some implementations, the semiconductor layer stack includes alternating first semiconductor layers and second semiconductor layers, such that after forming the oxide layer, the channel region includes a nanowire of the first semiconductor material disposed between nanocrystal floating gates of the second semiconductor material.

An exemplary non-volatile memory device includes a heterostructure disposed over a substrate. A gate structure is disposed over a portion of the heterostructure, the gate structure traversing the heterostructure, such that the gate structure separates a source region and a drain region of the heterostructure and a channel region is defined between the source region and the drain region. A nanocrystal floating gate is disposed in the channel region of the heterostructure between a first nanowire and a second nanowire, wherein the first nanowire and the second nanowire extend between the source region and the drain region. In some implementations, the heterostructure includes at least one first semiconductor layer of a first semiconductor material and at least one second semiconductor layer of a second semiconductor material, the second semiconductor material being different than the first semiconductor material. The first nanowire and the second nanowire may be of the first semiconductor material, while the nanocrystal floating gate may be of the second material. In some implementations, the second nanowire is disposed between the nanocrystal floating gate and another nanocrystal floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a non-volatile memory device, the method comprising:
    forming a heterostructure over a substrate, wherein the heterostructure includes at least one semiconductor layer pair having a first semiconductor layer and a second semiconductor layer disposed over the first semiconductor layer, the second semiconductor layer being different than the first semiconductor layer;
    forming a gate structure that includes a dummy gate over a portion of the heterostructure, the gate structure traversing the heterostructure, such that the gate structure separates a source region and a drain region of the heterostructure, a channel region being defined between the source region and the drain region; and
    during a gate replacement process for replacing the dummy gate with a control gate over the channel region, forming a nanocrystal floating gate in the channel region from the second semiconductor layer.

2. The method of claim 1, further comprising forming a nanowire in the channel region from the first semiconductor layer during the gate replacement process.

3. The method of claim 1, wherein the gate structure further includes gate spacers and sacrificial gate spacers, the method further comprising:
    removing the sacrificial gate spacers to form a first opening in the gate structure that exposes a portion of the heterostructure; and
    removing the second semiconductor layer from the exposed portion of the heterostructure in the first opening.

4. The method of claim 3, further comprising:
    removing the dummy gate to form a second opening in the gate structure that exposes a remaining portion of the second semiconductor layer in the channel region; and
    forming an oxide layer over the remaining portion of the second semiconductor layer.

5. The method of claim 4, wherein the forming the oxide layer includes:
    oxidizing a portion of the remaining portion of the second semiconductor layer and a portion of the first semiconductor layer exposed by the second opening, wherein the second semiconductor layer oxidizes at a higher rate than the first semiconductor layer; and
    removing the oxidized portion of the first semiconductor layer.

6. The method of claim 3, wherein the removing the second semiconductor layer includes performing a selective etching process, wherein the second semiconductor layer has a different etch rate than the first semiconductor layer.

7. The method of claim 1, wherein the heterostructure includes a first semiconductor layer pair and a second semiconductor layer pair disposed over the first semiconductor layer pair, the first semiconductor layer pair and the second semiconductor layer pair each having the first semiconductor layer and the second semiconductor layer; and
    further wherein during the gate replacement process, a first nanocrystal floating gate is formed of the second semiconductor layer in the first semiconductor layer pair, a second nanocrystal floating gate is formed of the second semiconductor layer in the second semiconductor layer pair, and a nanowire is formed of the first semiconductor layer of the second semiconductor layer pair, the nanowire being disposed between the first nanocrystal floating gate and the second nanocrystal floating gate.

8. The method of claim 1, wherein the gate replacement process includes:
    forming a gate dielectric over the first semiconductor layer and the nanocrystal floating gate in the channel region; and
    forming a gate electrode over the gate dielectric, wherein the gate includes the gate dielectric and the gate electrode.

9. The method of claim 1, further comprising forming a control gate contact electrically coupled to the control gate, a source contact electrically coupled to the source, and a drain contact electrically coupled to the drain.

10. The method of claim 1, further comprising forming epitaxial source/drain features in the source region and the drain region of the heterostructure before the gate replacement process.

11. A method for fabricating a non-volatile memory device, the method comprising:
    forming a semiconductor layer stack over a substrate, wherein the semiconductor layer stack includes at least one first semiconductor layer of a first semiconductor material and at least one second semiconductor layer of a second semiconductor material, the second semiconductor material being different than the first semiconductor material;
    forming a gate structure over a channel region of the semiconductor layer stack, wherein the gate structure includes a dummy gate stack, sacrificial gate spacers, and gate spacers;

removing the sacrificial gate spacers to form a first opening in the gate structure that exposes a first portion of the semiconductor layer stack in the channel region;

removing a portion of the at least one second semiconductor layer from the exposed first portion of the semiconductor layer stack;

removing the dummy gate stack to form a second opening in the gate structure that exposes a second portion of the semiconductor layer stack in the channel region, wherein the exposed second portion includes at least one second semiconductor layer island;

forming an oxide layer over the at least one second semiconductor layer island; and forming a metal gate stack in the second opening of the gate structure.

12. The method of claim 11, wherein the gate structure traverses the semiconductor layer stack in a manner that separates a source region and a drain region of the semiconductor layer stack, the channel region extending horizontally between the source region and the drain region, the method further including forming epitaxial source/drain features over the semiconductor layer stack in the source region and the drain region.

13. The method of claim 11 wherein the forming the oxide layer includes oxidizing portions of the at least one second semiconductor layer island, such that the at least one second semiconductor layer island is surrounded by the oxide layer.

14. The method of claim 13, wherein the forming the oxide layer further includes:

oxidizing portions of the at least one first semiconductor layer in the exposed second portion of the semiconductor layer stack; and removing the oxidized portions of the at least one first semiconductor layer.

15. The method of claim 11, wherein the forming the gate structure includes:

forming the sacrificial gate spacers adjacent to the dummy gate, wherein the sacrificial gate spacers include a first spacer material; and forming the gate spacers adjacent to the sacrificial gate spacers, wherein the gate spacers include a second spacer material having a different etching rate than the first spacer material.

16. The method of claim 11, wherein the forming the metal gate stack in the second opening of the gate structure includes:

forming a gate dielectric over the first semiconductor layer in the exposed second portion of the semiconductor layer stack and the oxide layer; and forming a gate electrode over the gate dielectric.

17. The method of claim 11, wherein the first opening is defined between the dummy gate stack and the gate spacers, and the second opening is defined between the gate spacers.

18. The method of claim 11, wherein the semiconductor layer stack includes alternating first semiconductor layers and second semiconductor layers, such that after forming the oxide layer, the channel region includes a nanowire of the first semiconductor material disposed between nanocrystal floating gates of the second semiconductor material.

19. A method for fabricating a non-volatile memory device, the method comprising:

forming a fin structure over a substrate, wherein the fin structure includes at least one first semiconductor layer of a first semiconductor material and at least one second semiconductor layer of a second semiconductor material, the second semiconductor material being different than the first semiconductor material;

forming a gate structure that includes a dummy gate over a portion of the fin structure, the gate structure traversing the fin structure, such that the gate structure separates a source region and a drain region of the fin structure, a channel region being defined between the source region and the drain region; and during a gate replacement process for replacing the dummy gate with a control gate over the channel region, forming a nanowire in the channel region from the first semiconductor layer and a nanocrystal floating gate in the channel region from the second semiconductor layer.

20. The method of claim 19, wherein the gate structure further includes gate spacers and sacrificial gate spacers, the method further comprising:

removing the sacrificial gate spacers to form a first opening in the gate structure that exposes a portion of the fin structure;

removing the second semiconductor layer from the exposed portion of the fin structure in the first opening;

removing the dummy gate to form a second opening in the gate structure that exposes a remaining portion of the second semiconductor layer in the channel region; and forming an oxide layer over the remaining portion of the second semiconductor layer.

* * * * *